(12) United States Patent
Kumar et al.

(10) Patent No.: US 9,997,353 B1
(45) Date of Patent: Jun. 12, 2018

(54) SILICON COMPOSITE SUBSTRATES

(71) Applicants: Ananda H. Kumar, Fremont, CA (US); Srinivas H. Kumar, Fremont, CA (US); Tue Nguyen, Fremont, CA (US)

(72) Inventors: Ananda H. Kumar, Fremont, CA (US); Srinivas H. Kumar, Fremont, CA (US); Tue Nguyen, Fremont, CA (US)

( * ) Notice: Subject to any disclaimer, the term of this patent is extended or adjusted under 35 U.S.C. 154(b) by 0 days. days.

(21) Appl. No.: 15/498,468

(22) Filed: Apr. 26, 2017

Related U.S. Application Data

(63) Continuation-in-part of application No. 14/859,312, filed on Sep. 20, 2015, now abandoned, which is a continuation-in-part of application No. 14/251,634, filed on Apr. 13, 2014, now Pat. No. 9,337,024, which is a continuation of application No. 13/337,045, filed on Dec. 23, 2011, now Pat. No. 8,697,541.

(60) Provisional application No. 62/053,115, filed on Sep. 20, 2014, provisional application No. 61/427,142, filed on Dec. 24, 2010.

(51) Int. Cl.
| | |
|---|---|
| *H01L 21/30* | (2006.01) |
| *H01L 21/02* | (2006.01) |
| *H01L 29/20* | (2006.01) |
| *C30B 1/02* | (2006.01) |
| *C30B 29/06* | (2006.01) |
| *C30B 25/18* | (2006.01) |

(52) U.S. Cl.
CPC .......... *H01L 21/0245* (2013.01); *C30B 1/026* (2013.01); *C30B 25/18* (2013.01); *C30B 29/06* (2013.01); *H01L 21/0254* (2013.01); *H01L 21/0262* (2013.01); *H01L 21/02422* (2013.01); *H01L 29/2003* (2013.01)

(58) Field of Classification Search
CPC .......... H01L 21/76245; H01L 21/2007; H01L 21/76251; H01L 21/76254
USPC ................... 438/455, 458, 459; 257/618–620
See application file for complete search history.

(56) References Cited

U.S. PATENT DOCUMENTS

| | | | | |
|---|---|---|---|---|
| 5,518,969 A | * | 5/1996 | Ragan ................... | C03C 14/004 264/656 |
| 6,362,496 B1 | * | 3/2002 | Nanishi ............. | H01L 21/02381 257/103 |
| 9,257,328 B2 | * | 2/2016 | Daigler ............. | H01L 21/76254 257/347 |
| 2010/0295105 A1 | * | 11/2010 | Fukushima ......... | H01L 27/1214 257/288 |
| 2011/0075372 A1 | * | 3/2011 | Zimbeck ............... | F28D 15/046 361/700 |
| 2011/0186336 A1 | * | 8/2011 | Nakayama ............. | B24C 3/322 174/255 |

(Continued)

*Primary Examiner* — Hsien Ming Lee

(57) ABSTRACT

A composite substrate includes a single crystal silicon layer on a glass or glass ceramic layer on a support layer can be used to form GaN layer without cracks. The glass or glass ceramic layer can have a set point and/or strain point below the deposition temperature of GaN, which can assist in releasing stress in the deposited GaN layer. Additionally, the composite substrate can be exposed to a heated and dry hydrogen ambient to reduce an oxide layer between the silicon layer and the glass or glass ceramic layer, to allow the formation of free standing GaN layer.

11 Claims, 28 Drawing Sheets

(56) References Cited

U.S. PATENT DOCUMENTS

2013/0020726 A1* 1/2013 Kim ............... H01L 23/367
257/787
2014/0072813 A1* 3/2014 Fujii ............... C08G 73/14
428/435

* cited by examiner

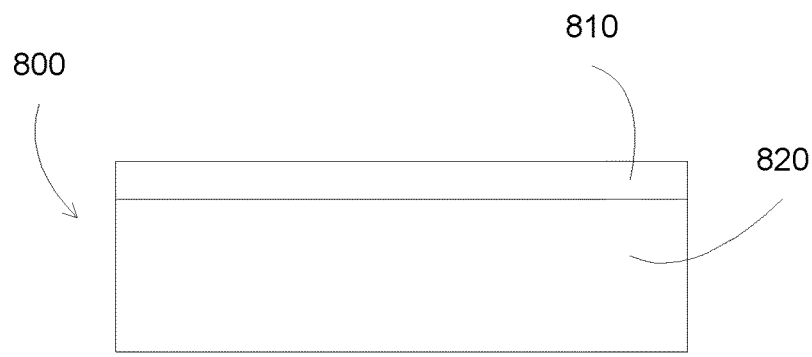
Fig. 8A
Fig. 8B
Providing a composite substrate, wherein the composite substrate comprises a single crystal layer disposed on a support layer, wherein the coefficient of expansion of the support layer is higher than the coefficient of expansion of the single crystal layer
880
Depositing a layer of GaN on the composite substrate
881
Fig. 8C Providing a composite substrate, wherein the composite substrate comprises a single crystal layer disposed on a glass layer on a support layer, wherein the coefficient of expansion of the support layer is higher than the coefficient of expansion of the single crystal layer
1700

Depositing a layer of GaN on the composite substrate
1710

Providing a composite substrate, wherein the composite substrate comprises a single crystal layer disposed on a support layer, wherein the coefficient of expansion of the support layer is higher than the coefficient of expansion of the single crystal layer
2000

Depositing a layer of GaN on the composite substrate
2010

Removing the single crystal layer at a temperature similar to the GaN deposition temperature, wherein the GaN is released from the single crystal layer
2020

Bringing the free-standing GaN to room temperature
2030

Fig. 20

```
┌─────────────────────────────────────────┐
│  Providing a composite substrate, wherein the │
│  composite substrate comprises a single crystal │
│  layer disposed on a glass layer on a support layer │
│                    2200                          │
└─────────────────────────────────────────┘
                    │
                    ▼
┌─────────────────────────────────────────┐
│  Exposing the composite substrate to a dry hydrogen │
│  ambient to separate the silicon layer from the glass │
│                    layer                         │
│                    2210                          │
└─────────────────────────────────────────┘
                    │
                    ▼
┌─────────────────────────────────────────┐
│  Depositing a layer of GaN on the composite substrate │
│                    2220                          │
└─────────────────────────────────────────┘
                    │
                    ▼
┌─────────────────────────────────────────┐
│  Removing the single crystal layer at a temperature │
│  similar to the GaN deposition temperature, wherein the │
│  GaN is released from the single crystal layer   │
│                    2230                          │
└─────────────────────────────────────────┘
                    │
                    ▼
┌─────────────────────────────────────────┐
│  Bringing the free-standing GaN to room temperature │
│                    2240                          │
└─────────────────────────────────────────┘
```

Fig. 22

SILICON COMPOSITE SUBSTRATES

The present invention is a continuation-in-part of and claims priority from U.S. patent application Ser. No. 14/859,312, filed on Sep. 20, 2015, which claims priority from U.S. Provisional Patent application Ser. No. 62/053,115 filed on Sep. 20, 2014, entitle: "Silicon composite substrates", and which is a continuation-in-part of and claims priority from U.S. patent application Ser. No. 14/251,634 filed on Apr. 13, 2014, which is a continuation of U.S. patent application Ser. No. 13/337,045, filed on Dec. 23, 2011, which is now U.S. Pat. No. 8,697,541, entitled "Methods and structures for preparing single crystal silicon wafers for use as substrates for epitaxial growth of crack-free gallium nitride films and devices"; which claims priority from U.S. provisional patent application Ser. No. 61/427,142, filed on Dec. 24, 2010, entitled "Methods and structures for preparing single crystal silicon wafers for use as substrates for epitaxial growth of crack-free gallium nitride films and devices", all of which are incorporated herein by reference.

BACKGROUND

Single crystal gallium nitride is a technologically important material finding increasing use in high frequency RF devices, and Light Emitting Diodes (LEDs). In the absence of methods to form single crystals of this and similar materials from melt, they are invariably grown by heteroepitaxy by metal-organic chemical vapor deposition, M-O-CVD, or by atomic layer deposition, ALD, on single crystal substrates of sapphire (Al2O3), or silicon carbide (SiC), because of their refractory nature, purity, inertness, and reasonably close lattice structure match to gallium nitride. Both sapphire and silicon carbide are in themselves extremely hard to grow as single crystals, the larger the diameter, the harder to make them. Until recently, nearly 90% of gallium nitride crystals were grown on 2-inch diameter. Only in 2009 this percentage dropped below 50%, and now most new LED fabricators are using 4" substrates, and some even venturing into 6" diameter sapphire wafers. Growing GaN on single crystal silicon carbide is somewhat easier because of closer lattice matching, but silicon carbide wafers are stuck at 2" diameter. GaN growth, on the small diameter sapphire wafers entails an enormous loss of productivity. This is a great impediment to them affordable for replacing the incandescent lighting. It is for this reason that there has been a continuing effort to use silicon wafers as substrates for GaN Epitaxy.

If silicon wafers can be used easily for growing gallium nitride, the advantages of larger wafer sizes, wide availability, atomically smooth growth surfaces, would quickly lead to their wide adoption. Why is this not the case? Growing GaN epitaxially on silicon (111) would face both a larger lattice mismatch (17%), and a larger thermal expansion mismatch (about 50%). Researchers have been able to bridge the lattice mismatch the same way as is done in cases of sapphire and silicon carbide, here using buffer layers of AlGaN to grow low defect GaN films on silicon. This greatly reduces the lattice strain in GaN layer and, as a result, reduces the dislocation density to reasonable levels. However, the sign and magnitude of thermal contraction mismatch between GaN and silicon, are such to give rise to extensive cracking of the latter upon cooling. In practical terms, this limits the thickness and size of useful devices, and the yield of such devices.

Some ingenious methods for growing GaN on silicon have been developed to enable the use of silicon substrates for GaN growth. Almost all these methods are based on modifying the growth surface with a) use of multiple or varied buffer layers, b) limiting the size of crystals growing and of crack prorogation by scoring the silicon wafer surface, c) limiting growth surface with in-situ silicon nitride masking, and allowing for lateral growth over the masked areas to fill the surface, and d) to change the growth morphology to nano rods. Even with these difficulties, after years of development, limited commercial production of GaN on silicon substrates has just begun.

The one case where a silicon wafer was modified on the non-growth side missed the mark. They attached very thin silicon 111 wafer, or very thin single crystal silicon carbide wafer, to polycrystalline silicon carbide wafers, apparently to reduce cost of the growth wafers. They missed the mark in the sense, that the support wafer bonded to the growth wafer, either had the same or similar coefficient of thermal expansion to silicon, in one case, and silicon carbide, in another, to make any difference in the cracking behavior. Even then, the researchers reported growing good quality GaN epitaxial layers on 2" substrates.

BRIEF DESCRIPTION OF THE DRAWINGS

FIGS. 8A-8C illustrate a process flow for forming a GaN substrate according to some embodiments of the present invention.

FIG. 20 illustrates a flow chart for forming a GaN substrate according to some embodiments.

FIG. 22 illustrates a flow chart for forming a GaN substrate according to some embodiments.

DETAILED DESCRIPTION OF THE PREFERRED EMBODIMENTS

Figure 1A:
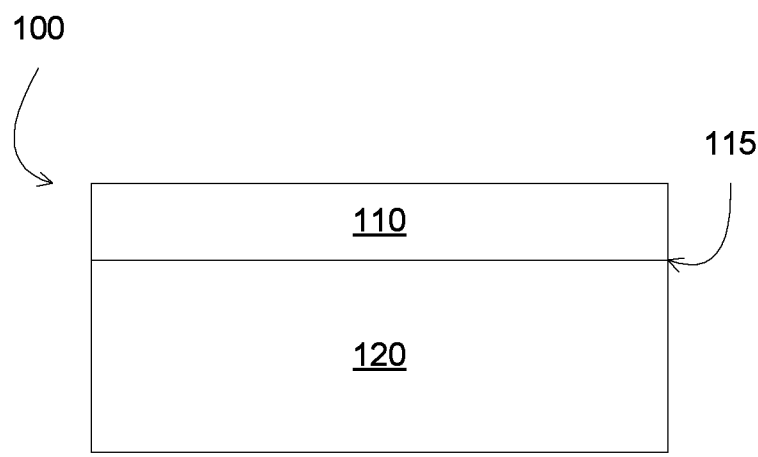
FIGS. 1A-1B illustrate exemplary composite substrates according to some embodiments of the present invention.

In some embodiments, this invention relates to preparing single crystal silicon wafer for epitaxially growing gallium nitride, which can prevent the cracking that generally occurs in the deposited gallium nitride film, upon cooling from the elevated growth temperatures. More particularly the invention teaches a new approach that involves modifying the silicon (111) wafer substrate, on the side opposite to the gallium nitride growth side, by coating of a suitable material having a thermal expansion higher than that of GaN. This layer, hereinafter referred to as a 'stabilizing layer', induces compressive stresses in both the silicon and the GaN layers, upon cooling from room temperature. Since the induced compressive stress permeates into the GaN layer, though the silicon wafer, it in effect neutralizes the tensile stress induced in the GaN by silicon and, thereby, stabilizes it.

In some embodiments, the silicon substrate is first prepared by integrally attaching, or forming the stabilizing layer, in a separate step prior to using it for epitaxial deposition of gallium nitride. At the GaN growth step, the epitaxially deposited GaAlN or similar buffer layers, commonly known in the art, are first deposited on the (111) Si surface to bridge the lattice mismatch to GaN, followed by the deposition of GaN layer. Upon cooling to ambient temperature, the GaN layer will remain intact without cracking. The composite wafer can be processed for device making and forming interconnections, after which it can be diced, and separated from silicon layer by etching off the latter.

In some embodiments, the stabilizing layer can be a refractory material, such as a thin film of metal or ceramic, thick film metal or ceramic, or bulk substrates of metal, ceramic or glass integrally bonded to the silicon wafer surface. It is preferred that the material of the stabilizing layer have a coefficient of thermal expansion, CTE, higher than that of GaN. The silicon wafer can be in pre-stressed condition after the application of the stabilizing layer, which generally requires a higher temperature deposition for the layer. The thickness of the stabilizing layer can be such as to induce compressive stress in the silicon upon cooling from the layer application temperature. In fact, the compressive stress can be sufficiently high also to induce compressive stress in the gallium nitride after its deposition on the silicon wafer, and cooling to ambient temperature. The stress level is a function of the nature of the coating material; the process used for its application, in particular the application temperature, its CTE, and thickness. Thinner silicon wafers are preferred, because thinner stabilizing layers can be used to obtain the desired effect on the deposited gallium nitride. These parameters can be modeled from known thermal, mechanical and physical properties of silicon, the stabilizing layer, and gallium nitride film. It is much more easily determined, at the outset, from well designed experimentation.

Figure 1B:
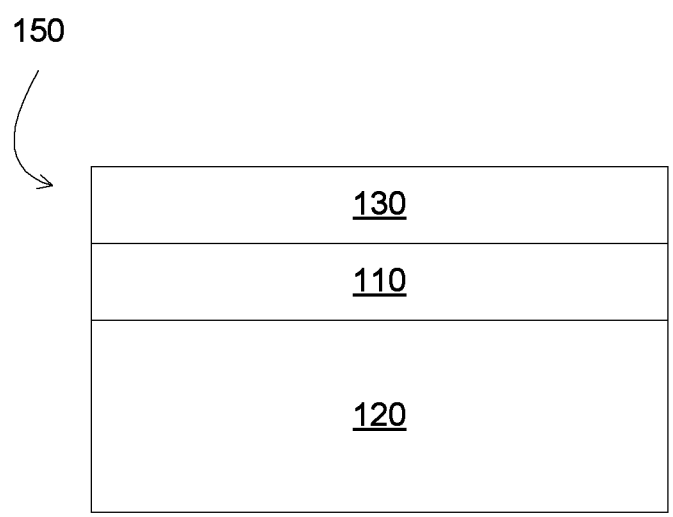

FIGS. 1A-1B illustrate exemplary composite substrates according to some embodiments of the present invention. In FIG. 1A, a composite substrate 100 is shown, including a thin layer 110 disposed on a thicker layer 120. The thin layer 110 can include a single crystal layer, such as single crystal silicon layer, or silicon layer doped with a dopant material, or silicon germanium or silicon carbide layer. The single crystal silicon layer can have a surface lattice close to GaN (a=3.189 A), such as silicon with (111) surface (a=3.84 A), silicon doped with a smaller lattice constant material such as carbon, or silicon carbide layer. The thickness of the single crystal layer can be less than 5 microns, less than 1 micron, or less than 0.5 micron. In some embodiments, the thickness of the single crystal layer can be less than 500 micron thick, less than 100 microns, or between 10 and 50 microns.

In some embodiments, the support layer has coefficient of thermal expansion (CTE) higher than that of GaN. Also, the effective CTE of the composite substrate 100 is higher than that of GaN so that a subsequently deposited GaN layer on the silicon substrate 110 does not crack at room temperature.

In some embodiments, the thicker layer 120 can include a high CTE layer such as a glass layer or a glass-ceramic layer. The CTE value of the thicker layer 120 can be higher than that of the thinner layer 110, e.g., higher than that of silicon. For example, the CTE value of the thicker layer 120 can be greater than about 3 (as compared to silicon of 2.6), such as 3.5 for glass, 3.4 for silicon nitride, or 8 for aluminum oxide. The thickness of the high CTE glass or glass-ceramic layer can be configured to form a composite substrate (e.g., combined with the thinner layer 110) that has a comparable CTE with LED materials such as GaN. For medium CTE values, e.g., between 3 and 7, the thickness of the high CTE layer can be more than 50 microns, more than 100 microns, or more than 200 microns. For high CTE values, e.g., higher than 7, the thickness of the high CTE layer can be more than the thickness of the thinner layer 110, such as more than 1 micron, more than 5 microns, more than 10 microns, or more than 20 microns. In some embodiments, the thicker layer 120 can be functioned as a handle layer, thus a thickness of more than 100 microns can be used. For example, thicknesses in the range of a few hundred microns can be used to be compatible with silicon substrates, such as thicker than 500 microns or thicker than 1 mm.

In some embodiments, the thinner layer 110 can be fabricated by exfoliation. For example, a single crystal substrate can be implanted with an implantation species, such as hydrogen or helium. Upon a thermal anneal, the implantation species can coalesce, which can form a defect plane to exfoliate the top layer of the substrate. The thickness of the exfoliated layer can be determined by the depth of the implantation species, for example, at 0.3, 0.5, 1, 5, 10 or even 20 microns.

In some embodiments, since the exfoliated layer can be thin, the substrate surface can be bonded to another layer, such as the thicker layer 120, before performing the exfoliation process.

In some embodiment, an adhesive layer 115 is disposed between the silicon layer 110 and the support layer 120, for example, to strengthen the bond between the two layers. For example, the support layer and the silicon layer are strongly bonded together, and thus acting as a composite substrate with respect to thermal expansion. The effective thermal expansion of the composite substrate is a result of a balance between the high thermal expansion of the support layer and the low thermal expansion of the silicon. The effective coefficient of thermal expansion can be calculated from the thermal expansion of the composite substrate. In general, the coefficient of thermal expansion is related to the individual coefficients of thermal expansion and thicknesses of the support layer and the silicon substrate. For example, a much thicker support layer will provide an effective coefficient of thermal expansion similar to that of the support layer, since the effect of the silicon layer is smaller.

In FIG. 1B, a composite substrate 150 is shown, comprising a GaN layer 130 disposed on a silicon layer 110 disposed on a support layer 120. The substrate 150 can be formed by depositing a GaN layer on a substrate 110. In some embodiments, the thickness of the GaN is higher than 2 microns, and can be higher than 5 microns. The effective CTE of the composite substrate 150 is higher than that of GaN so that the GaN layer does not crack after cooled to room temperature. In some embodiments, the GaN layer comprises a buffer layer under a GaN layer for lattice matching with the silicon layer 110.

While the present description utilizes single crystal silicon substrates, other substrates can be used, such as silicon-containing substrates (e.g., SiGe substrates, composite substrates having a silicon layer on a support substrate, etc.).

Without limiting the scope of this invention the types of stabilizing layer can be categorized into several categories, viz. (i) vacuum deposited thin films of metal or ceramic, (ii) thick films (of metal, ceramic, or glass), (iii) bulk substrates (of metal, glass, or ceramic) with an attachment layer of glass or metal, (iv) in-situ formed glass-ceramic coatings.

(i) Depositing Stabilizing Layers:

In some embodiments, highly stressed films can be deposited, for example, at the backside of the silicon substrate. If the stress of the composite substrates (e.g., silicon substrates having the deposited films) is sufficiently high, it can compensate for the stress induced by the GaN when cooling, and the stress of the GaN would be compressive. In terms of thermal expansion, if the thermal expansion of the composite substrates is higher than that of the GaN, this would prevent cracking in the GaN upon cooling, with the stress of the GaN compressive.

In some embodiments, sputtered or evaporated thin films of refractory metals such as molybdenum and tungsten, if deposited at elevated temperatures, can induce large compressive stress in silicon. This process would be a natural choice in the semiconductor processing culture, if the selected metals are not detrimental to the subsequent processes, e.g., do not introduce contamination to the GaN layer (or to the devices that form on the silicon substrate), for example, reacting with the process gases, the silicon substrate, and gallium nitride. The economics of this approach depends on the thickness of films required to achieve the desired level of beneficial compressive stress in the gallium nitride layer later grown on the silicon wafer. The advantages of this method are clean processing, ease of thickness control, good thermal conductivity of metal films, and compatibility with downstream device processing.

In addition to metals, other material, such as ceramic films deposited by a sputtered process, can also be used to induce the desired stress in the silicon substrate. The thickness of such sputtered ceramic films would need to be optimized, since thin films with inadequate thickness might not be able to withstand the balancing tensile stress and the subsequently deposited gallium nitride would crack upon cooling.

(ii) Coating Stabilizing Layers:

In some embodiments, alternating to deposition processes, such as vacuum thin film deposition processes, other coating processes can be used to form a composite substrate that can sustain the device fabrication processes, for example, the high temperature deposition of GaN.

In some embodiments, thick films are formed by applying to substrate powders of ceramics, glass, or metals, in the form of a spray-able slurry, or printable paste (such as metal inks) with suitable organic binders and solvents, followed by heating to expel the organics, and sinter the powder to produce bulk coatings on the substrate. To improve the adhesion of the consolidated ceramic or metal powders to the underlying substrates, an adhesive can be used, such as mixing a glass powder with the ceramic or metal powder. The glass powder would melt and help consolidate the ceramic powder and also bond to the oxidized silicon surface. The adhesive would need to be optimized to prevent interfering with the subsequent device processing. For example, certain glass powder exhibits temperature softening in the glass phase, and thus limiting the refractoriness in the formation of the stabilizing layer, which can be a serious limitation for using thick film stabilizing layers for typical gallium nitride growth temperatures.

Other criterions would also need to be considered in the material and process selections for forming the thick film coating, such as metal contamination, softening, and compatibility with downstream device processing.

(iii) Bulk Substrates for Stabilizing Layer:

In some embodiments, bulk metal, such as stainless steel, molybdenum, tungsten, and bulk ceramic substrates of polycrystalline aluminum oxide, aluminum nitride, zirconia, can be used as the support layer. Adhesion additives can be used, since metal substrates and ceramic substrates might be separated at high temperature. Exemplary adhesion materials include a glass or metal bonding layer at the interface. The same is true for glass substrates such as those made of Pyrex or similar refractory glass. Limitations in size and cost for these substrates are a further factor to be considered.

(iv) In-Situ Formed Glass-Ceramic Coating or Substrates for Stabilizing Layer:

In some embodiments, powders of certain glass compositions, when heated to temperatures in the range of the softening point of the corresponding bulk glass, crystallize and densify to yield essentially a ceramic body more refractory than the parent glass. If these glass powders are suitably disposed on a suitable substrate, such as a silicon wafer, they would also adhere well to the substrate during such consolidation. This provides a convenient method for forming self-adhering, refractory stabilizing layer of this invention on the silicon wafer, provided the CTE of the resulting glass-ceramic is higher than the CTE of gallium nitride. A convenient method to dispose the glass powder is to first form a green tape of the glass powder by mixing it with suitable polymeric binders and plasticizers and solvents. The green tape technology is already well developed for fabricating so called Low Temperature Co-fired Ceramic, or simply LTCC substrates. Details of the LTCC substrates have been disclosed in co-pending patent application Ser. No. 12/558,486 and 12/558,490, hereby incorporated by reference.

A wide choice of glass compositions are known in the literature with the desired sintering and crystallizing characteristics. These glass compositions have been developed for fabricating low temperature co-fired ceramic, or simply LTCC, substrates. In our preferred approach, glasses in the $MgO$—$Al_2O_3$—$SiO_2$ system, having MgO in the range of 15-28% by weight, $Al_2O_3$ in the range of 9-15% by weight, the remainder made of silica, except for less than 2% of other ingredients such as $TiO_2$, $ZrO_2$, $P_2O_5$, or $B_2O_3$. The glass powders of these compositions fully densify in the temperature range of 850° C. to 950° C., and yielding dense, strong glass-ceramics having thermal expansion coefficients in the range of 4-6.5 ppm/° C., higher that of both silicon and gallium nitride, as desired.

In some embodiments, to form the stabilizing layer of this invention, the green ceramic tape of the suitably chosen glass powder is applied to the single crystal silicon wafer, typically of (111) orientation, on the side opposite to the polished side reserved for later gallium nitride deposition. The green tape is placed on the silicon surface and heated to temperatures of 50-100° C., and at pressures of 500-1000 psi designed to soften and stick it securely to the wafer surface. The wafer-green tape assembly is then cured at the required high temperature. During this consolidation the glass sinters to a strong and dense, glass-ceramic body, strongly bonded to the oxidized silicon surface. On cooling from the consolidation temperature, the differences in the thermal coefficients expansion, CTEs, of silicon and the resulting glass-ceramic will induce significant compressive stress in the silicon and corresponding tensile stress in the glass-ceramic stabilizing layer. The glass-ceramic layer should be sufficiently strong to resist cracking, and sufficiently thick to avoid excessive wafer bow.

This pre-stressed silicon is then cleaned and prepared for gallium nitride epitaxial deposition. At the deposition temperature, the wafer composite will be essentially stress-free and flat. As the wafer is cooled to ambient temperature, compressive stresses develop in both silicon and the gallium nitride layers, preventing cracking that would have otherwise occurred in the absence of the glass-ceramic stabilizing layer. The composite wafer is processed as needed to form discrete gallium nitride layers. The wafer is then diced, and devices are released by etching off the silicon.

Ceramic coatings for silicon wafers of this invention are fabricated from ceramic precursors suitably disposed on one of the major surfaces of the silicon wafer and heating in air to temperatures in the range of 800-1200 C, and more preferably to between 900-1100 C, expel the organic binders and consolidate the ceramic powder into bulk ceramic coatings, whose CTE will be in the range of 6-10×10 ppm/C. of GaN measured from its growth temperature of around 1000 C. Examples of suitable ceramic precursors include refractory ceramic powders, such as aluminum oxide, zirconium oxide, mullite, mixed with suitable glass powders that fuse during the first heating step to bind the ceramic powders to form a bulk ceramic coating having CTE equal to or greater that of gallium nitride In some embodiments, the glass powders can comprise glass compositions in systems in $MgO-Al_2O_3-SiO_2$, $CaO-Al_2O_3-SiO_2$, $BaO-Al_2O_3-SiO_2$, or mixtures thereof, which when heated to temperatures in the preferred temperature range of 900-1100 C, fuse and crystallize to form a bulk coating having CTE>CTE of GaN.

A composite structure consisting of a continuous (crack-free) single crystal gallium nitride layer greater than 2 micron thickness, single crystal silicon and polycrystalline ceramic coating having CTE higher than that of gallium nitride as measured from its (GaN's) growth temperature, in that order.

In some embodiments, gallium nitride layer may comprise gallium nitride layer may consist of suitable buffer layers aimed at bridging the mismatch in lattice between that of silicon and gallium nitride. Gallium nitride layer may consist of suitable gallium nitride alloy layers for electronic device fabrication. In some embodiments, electronic devices can be fabricated on the GaN layer, such as light emitting diode structures.

Figure 2A:
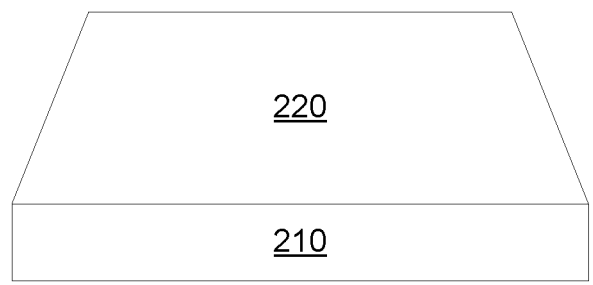
FIGS. 2A-2B illustrate an exemplary process flow for forming a composite substrate according to some embodiments of the present invention.
Figure 2B:
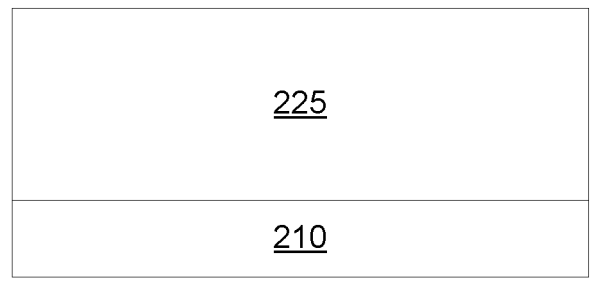

FIGS. 2A-2B illustrate an exemplary process flow for forming a composite substrate according to some embodiments of the present invention. In FIG. 2A, a paste or slurry of glass powder 220 is disposed on a silicon substrate 210. The slurry can be sprayed, or pasted on the silicon substrate. The slurry can comprise glass powder, polymeric binders, plasticizers, and solvents.

In FIG. 2B, the silicon substrate with the slurry layer is heated solidify the slurry, forming a composite substrate comprising a silicon layer 210 disposed on a ceramic layer 225.

Figure 3A:
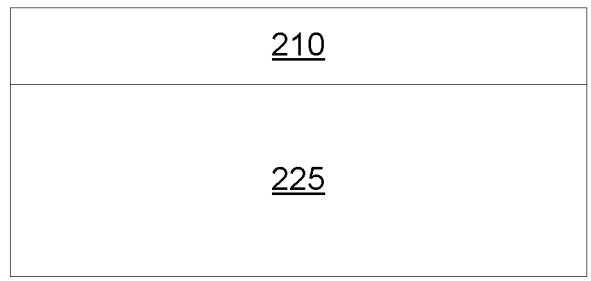
FIGS. 3A-3B illustrate an exemplary process flow for forming a composite GaN substrate according to some embodiments of the present invention.
Figure 3B:
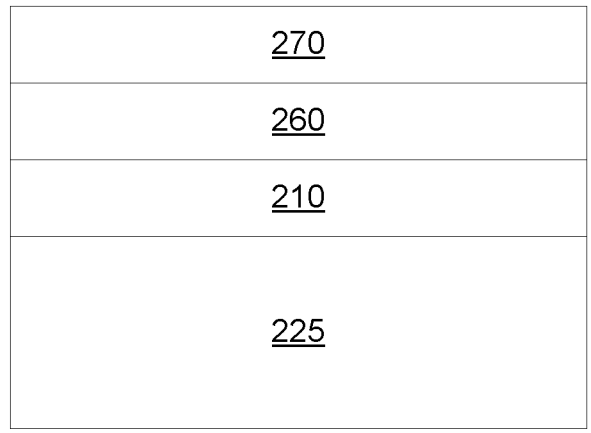

FIGS. 3A-3B illustrate an exemplary process flow for forming a composite GaN substrate according to some embodiments of the present invention. In FIG. 3A, a composite substrate comprising a silicon layer 210 disposed on a ceramic layer 225 is provided. The composite substrate can be prepared by attaching a ceramic layer on a silicon layer, such as in a process described above. In FIG. 3B, an optional buffer layer 260 is deposited on the composite substrate, followed by a GaN layer 270. The buffer layer 260 can serve as a lattice matching layer, to match the lattice of GaN with that of the silicon.

In some embodiments, the present invention discloses methods for forming a continuous (or crack-free) gallium nitride layer on silicon substrates. An exemplary method of forming a single crystal gallium nitride layer of thickness exceeding 2 microns on a single crystal silicon substrate can comprise the steps of a. Forming a polycrystalline ceramic layer having CTE greater than that of gallium nitride on one of the planar sides of a single crystal silicon substrate in a first heating step b. Cooling the ceramic-coated silicon substrate to ambient temperature c. Growing single crystal gallium nitride layer of thickness exceeding 2 microns in thickness on the silicon surface opposite to the ceramic coating on the silicon substrate in a second heating step d. Cooling the composite of single crystal gallium nitride layer e. Fabricating GaN nitride on the composite gallium nitride layer (optional)

In some embodiments, a ceramic precursor is disposed on the silicon substrate before the first heating step. After the first heating, the ceramic precursor solidifies and bonds with the silicon substrate to form a composite substrate. In some embodiments, forming step of polycrystalline ceramic layer having CTE equal to or greater that of gallium nitride including forming from ceramic powder precursors in the first heating step. The first heating step can be carried out to temperatures in the range of 800-1200, and most preferably to temperatures in the range of 900-1100 C.

In some embodiments, the ceramic precursors include refractory ceramic powders, such as aluminum oxide, zirconium oxide, mullite, mixed with suitable glass powders that fuse during the first heating step to bind the ceramic powders to form a bulk ceramic coating having CTE equal to or greater that of gallium nitride. The ceramic precursors can include certain glass powders, such as from glass compositions in systems in $MgO-Al_2O_3-SiO_2$, $CaO-Al_2O_3-SiO_2$, $BaO-Al_2O_3-SiO_2$, or mixtures thereof, which when heated to temperatures in the preferred temperature range fuse and crystallize to form a bulk coating having CTE>CTE of GaN. The single crystal silicon can be of (111) orientation. In some embodiments, the single crystal silicon surface is from (100) orientation, and which is then completely covered with pyramids of having (111) facets produced by anisotropic etching.

In some embodiments, growing gallium nitride step includes epitaxially depositing single crystal gallium nitride from pyrolitic decomposition of certain gallium metal organic gaseous precursors in MOCVD reactor at high temperatures. In some embodiments, growing gallium nitride step includes first depositing buffer layers aimed at bridging the lattices of silicon and of gallium nitride to be grown thereon. The buffer layers can include aluminum nitride, aluminum gallium nitride, zirconium fluoride, and others known in the art. Gallium nitride layer can include gallium nitride alloy layers required to form suitable device structures. For example, the alloy layers can include magnesium doped gallium nitride layers, or silicon doped gallium nitride layers. In some embodiments, gallium nitride devices including light emitting diodes (LED).

Figure 4:
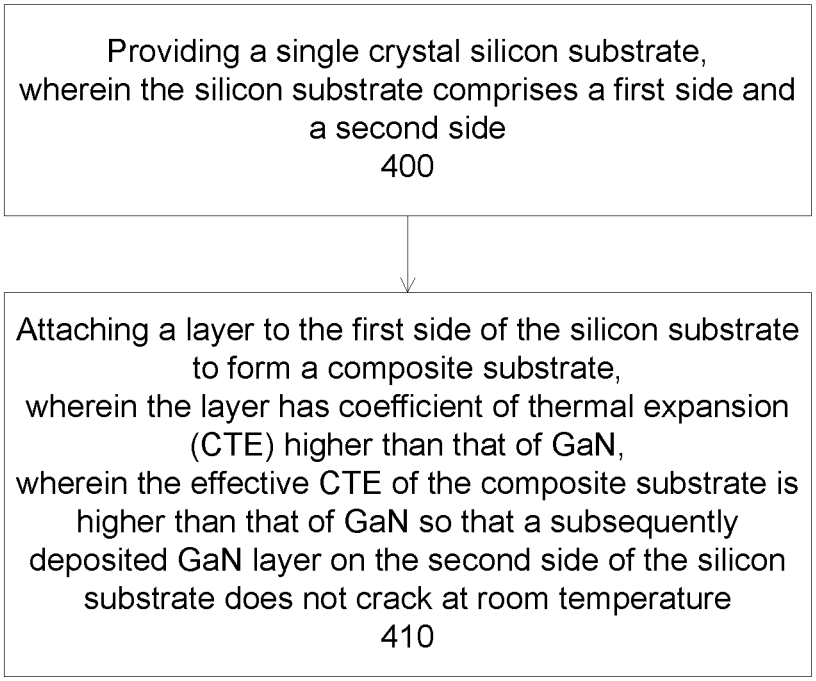
FIG. 4 illustrates an exemplary flowchart for forming a composite substrate according to some embodiments of the present invention.

FIG. 4 illustrates an exemplary flowchart for forming a composite substrate according to some embodiments of the present invention. Operation 400 provides a single crystal silicon substrate, wherein the silicon substrate comprises a first side and a second side. Operation 410 attaches a layer to the first side of the silicon substrate to form a composite substrate, wherein the layer has coefficient of thermal expansion (CTE) higher than that of GaN, wherein the effective CTE of the composite substrate is higher than that of GaN so that a subsequently deposited GaN layer on the second side of the silicon substrate does not crack at room temperature. In some embodiments, the method further comprises applying an adhesive to the first side of the silicon substrate before attaching the layer.

In some embodiments, the second side of the silicon substrate comprises a (111) crystallographic surface. The thickness of the silicon substrate can be less than 50 microns. The attaching the layer can comprise depositing the layer in vacuum. The layer can comprise a refractory metal or ceramic. The attaching the layer can comprise bonding a bulk metal layer or a bulk ceramic layer to the silicon substrate through an adhesion layer. The attaching the layer can comprise spraying a slurry on the silicon substrate and sintering to bond the slurry with the silicon substrate, wherein the slurry comprises a mixture of a powder of ceramic, glass, metal, or a combination thereof. The slurry can comprise an adhesive additive. The attaching the layer can comprise pasting a paste on the silicon substrate sintering to bond the paste with the silicon substrate, wherein the slurry comprises a mixture of a powder of ceramic, glass, metal, or a combination thereof. The paste can comprise an adhesive additive. The attaching the layer can comprise disposing a glass powder to the silicon substrate and sintering the glass powder to form the composite substrate.

Figure 5:
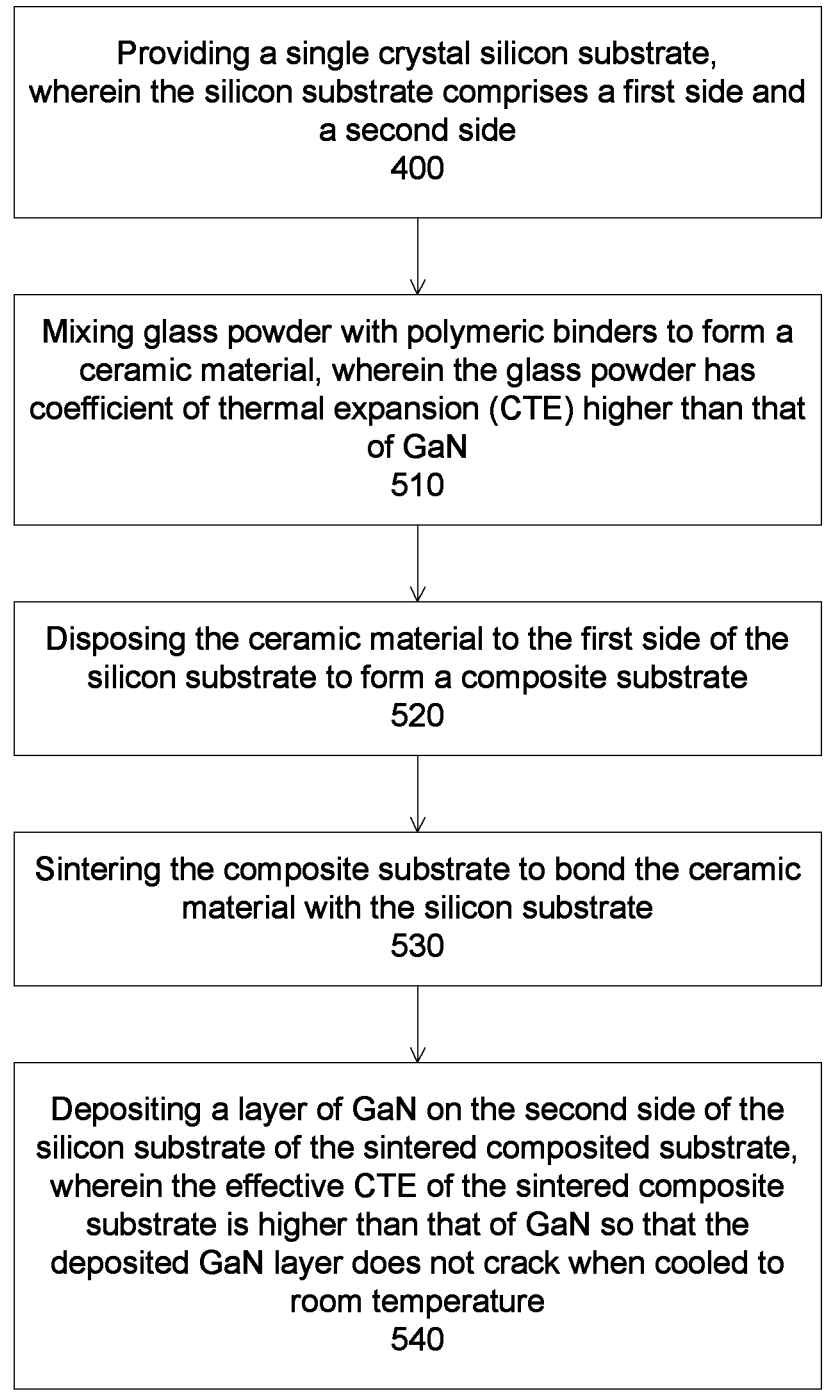
FIG. 5 illustrates another exemplary flowchart for forming a composite substrate according to some embodiments of the present invention.

FIG. 5 illustrates another exemplary flowchart for forming a composite substrate according to some embodiments of the present invention. Operation 500 provides a single crystal silicon substrate, wherein the silicon substrate comprises a first side and a second side. Operation 510 mixes glass powder with polymeric binders to form a ceramic material, wherein the glass powder has coefficient of thermal expansion (CTE) higher than that of GaN. Operation 520 disposes the ceramic material to the first side of the silicon substrate to form a composite substrate. Operation 530 sinters the composite substrate to bond the ceramic material with the silicon substrate. Operation 540 deposits a layer of GaN on the second side of the silicon substrate of the sintered composited substrate, wherein the effective CTE of the sintered composite substrate is higher than that of GaN so that the deposited GaN layer does not crack when cooled to room temperature. In some embodiments, a buffer layer is deposited before depositing the GaN layer. In some embodiments, the ceramic material comprises a magnesium oxide-aluminum oxide-silicon oxide composition. The sintering comprises annealing at temperature 850 to 950 C.

In some embodiments, the present invention discloses methods and systems for improving the quality and integrity of crystals grown hetro-epitaially on host single crystal films on support substrates, by substantially relieving the lattice mismatch stress during growth and the thermal expansion stress during cooling, by choosing support substrates having both a suitable thermal expansion coefficient and a strain point.

In some embodiments, the present invention discloses composite substrates, which can be used for the fabrication of LED (light emitting diode) devices. The composite substrates can be silicon-based substrates, which can be inexpensive, and potentially can be used to replace sapphire substrates ($Al_2O_3$:CTE=7.5, a=2.75 A).

Silicon substrates have been successfully used for growing GaN for LED devices. The large lattice mismatch between silicon and GaN can be addressed through the use of buffer layers of other crystalline materials, such as Aluminum Nitride, Gallium Aluminum Nitride, etc. ($a_{GaN}$=3.189 A; $a_{Si<100>}$=5.4 A; $a_{Si<111>}$=3.84 A). However, there is still a mismatch in the coefficients of thermal expansions (CTEs) of GaN and silicon ($CTE_{GaN}$=5.6; $CTE_{Si}$=2.6). The sign and magnitude of this mismatch between them are such that the GaN will be in tension when cooled from the growth temperature of about 1000 C. This tensile stress leads to extensive cracking of the GaN along its easy cleavage planes. A practical effect of this cracking is the limit of the substrate size, thickness and device sizes.

In some embodiments, the composite substrates can have a single crystal top surface, which can be used as a template for growing LED materials, such as GaN. The single crystal top surface can be provided by having a layer of single crystal silicon-containing material, such as silicon, or silicon-doped with carbon or germanium, or silicon carbide (SiC: CTE=4.2, a=3.08 A) or silicon germanium (SiGe). Single crystal silicon are readily available at low cost production, for example, at 150 mm, 200 mm, 300 mm, and even at 450 mm sizes. In some embodiments, germanium can be used (Ge <111>:CTE=5.9, a=4.0 A)

In some embodiments, the composite substrates can further have high coefficient of thermal expansion (CTE), e.g., higher than that of silicon. The CTE of the composite substrates can be comparable to that of GaN, so that there is little or no thermal expansion mismatch between the GaN layer growing on the silicon surface of the composite substrates.

In some embodiments, the composite substrate can include a layer of high CTE material coupled to the silicon layer. The thickness of the high CTE layer can be higher than that of the silicon layer, so that the high CTE layer dominates the thermal expansion. Additionally, the high CTE layer can include an insulator layer, such as, glass layer, or a glass ceramic layer having both a CTE and a set point; the latter defined as the temperature above which it behaves as a viscous fluid. The set point of the high CTE layer is generally about 25° C. above the glass transition temperature, Tg of the glass in the structure. The glass-ceramic, sometimes also referred to as glass-bonded ceramic, is defined as a fused mixture of a glass and a ceramic powder, which together form a solid ceramic on cooling and have a CTE higher than that of silicon, and close to that of gallium nitride. The strain point of the glass-ceramic is generally the same as the strain point of its glass bonding phase.

In some embodiments, the composite substrate can include a glass layer or a glass-ceramic layer coupled to the silicon layer. The glass or glass ceramic layer can have a set point, which is the temperature above which it behaves as a viscous fluid. The composite substrate can include a single crystal layer, such as a silicon layer, and a glass or glass ceramic layer. Some glass or glass ceramic layer can have high CTE value, e.g., higher than that of silicon. However, in some embodiments, the invention is not limited to high CTE glass or glass ceramic, and can include glass or glass ceramic layers having CTE values lower than that of silicon.

In some embodiments, the composite substrate can include a glass layer or a glass-ceramic layer coupled to the silicon layer, together with a support layer coupled to the glass or glass ceramic layer. The glass or glass ceramic layer can have CTE values higher or lower than that of silicon.

In some embodiments, the composite substrate can include a single crystal silicon containing layer on a high CTE layer. The thickness of the high CTE layer can be more than that of the silicon layer, or more than 10× or 100×. For example, the silicon layer can have a thickness of less than 1 micron, while the high CTE layer can have a thickness of more than 100 microns. The high thickness ration between the high CTE layer and the silicon layer can allow the composite substrate to have the thermal expansion behavior of the high CTE layer, meaning the composite substrate can have a thermal expansion coefficient higher than silicon, and can be similar to GaN to prevent thermal expansion mismatch during the fabrication of LED devices.

Figure 6A:
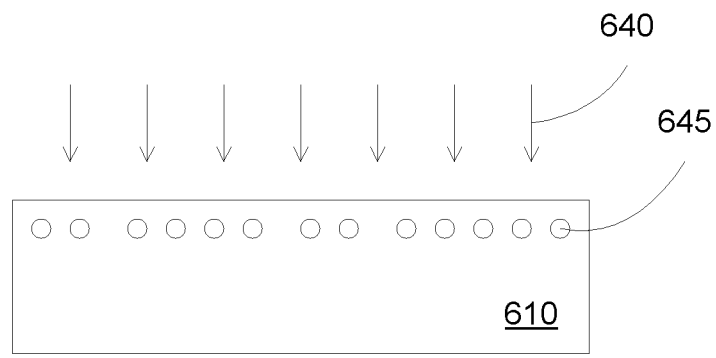
FIGS. 6A-6F illustrate a process for forming a composite substrate according to some embodiments.

FIGS. 6A-6F illustrate a process for forming a composite substrate according to some embodiments. In FIG. 6A, a substrate 610 can be provided. The substrate can be a single crystal substrate. For example, the substrate can be a silicon substrate, or a silicon containing substrate, such as silicon germanium or silicon carbide substrate. The surface lattice of the substrate 610 can be selected to be close to that of GaN for LED device fabrication. For example, the substrate can be a <111> silicon substrate, having surface lattice of 3.84 A, as compared to 3.189 A of GaN. Other substrates can be used, such as germanium substrates.

The substrate 610 can be implanted 640 with an implantation species such as hydrogen or helium. The energy of the implantation species can be configured to form a layer of defects 645 in the substrate 610.

Figure 6B:
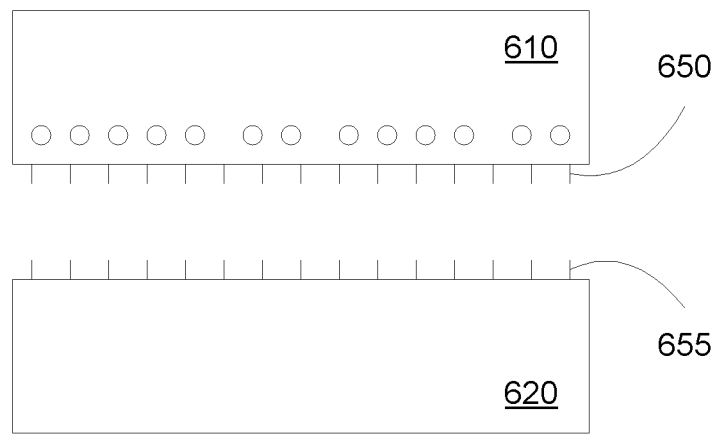

In FIG. 6B, the substrate 610 can be prepared for a bonding process with a high CTE substrate 620. For example, the substrates 610 and 620 can be cleaned in a wet cleaning process. The substrates can have a thin oxide grown on the surface, for example, by a plasma oxidation or a furnace oxidation process. After a cleaning process, the two substrates can have a clean surface, such as a hydrogen or OH terminated surface 650, 655. The clean surface 650 and 655 can facilitate the bonding between the substrates 610 and 620.

Figure 6C:
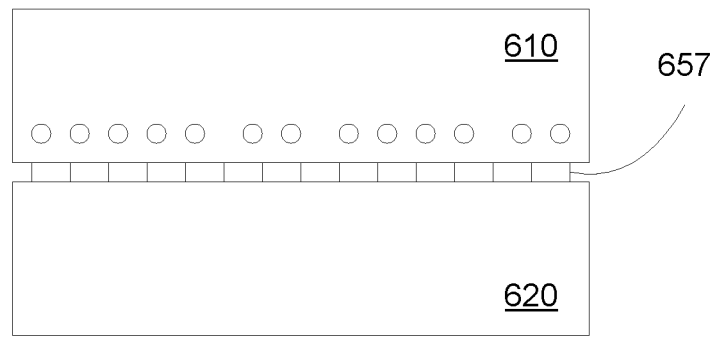

In FIG. 6C, after cleaning, the substrates can be brought together for a contact bonding. The substrates can be flat and clean, and when brought together in intimate contact, can form contact bonding 657. Hydrogen or OH terminated surfaces can be used to explain the bonds between the two substrates. However, the substrate surfaces can have different microscopic behaviors. In some embodiments, the substrate 610 can be a silicon substrate, which can be very flat and free of defects, after a cleaning process, such as an HF cleaning, SC1 clean ($H_2O_2+NH_4OH$) for organic contamination removal, and/or SC2 clean ($H_2O_2+H_2SO_4$) for ionic and metal contamination removal. The substrate 620 can also be flat and free of defects. The substrate 620 can include a glass substrate, a glass-ceramic substrate, or any other substrates or composite substrates which are flat, cleaned and have high CTE values.

The surface bonding 657 between substrates 610 and 620 can be strong, e.g., bonding the two substrates together. The surface bonding can be peeled off, e.g., lifting from one end and slowly separating the two substrates. However, the bond can be strong so that a high shear force or a high tension force could be needed to separate the substrates.

Figure 6D:
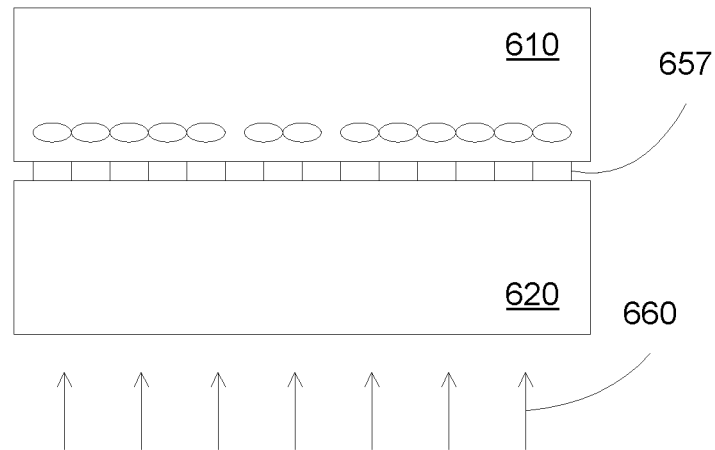

In FIG. 6D, the two substrates 610 and 620 can be subjected to a low temperature anneal 660, e.g., less than about 600 C, such as between 400 and 500 C. The thermal energy from the anneal process can coalesce the implantation species, forming a continuous defect layer that can separate the top portion of the substrate 610 from the body portion. The implantation species can migrate laterally to form a defect plane if prohibited from moving vertically to the surface. Thus the bond between the two substrate surfaces can be configured to provide an intimate contact, to prevent the implantation species from escape. Further, the substrate 620 can form a solid surface, which can also prevent the implantation species from penetrating the substrate 620.

Figure 6E:
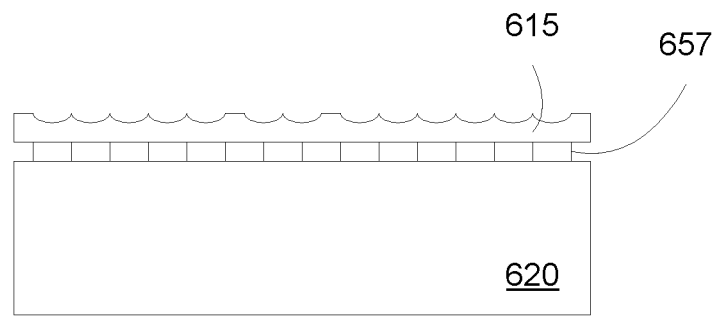
Figure 6F:
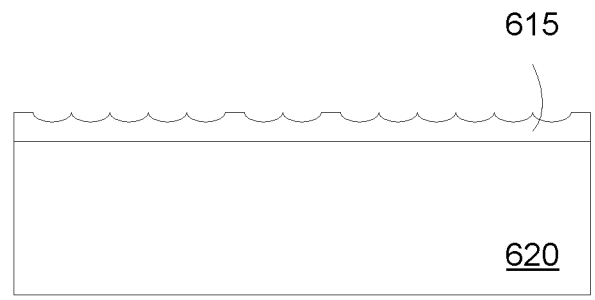

In FIG. 6E, the top surface layer 615 of the substrate 610 can be exfoliated, for example, at the defect plane formed by the implantation species. In FIG. 6F, an optional high temperature anneal can be performed, solidly bonding the top surface layer 615 to the substrate 620.

In some embodiments, the composite substrate can include the single crystal substrate 610 bonded with a glass or glass ceramic substrate 620 having a CTE value higher or lower than that of silicon.

Figure 7:
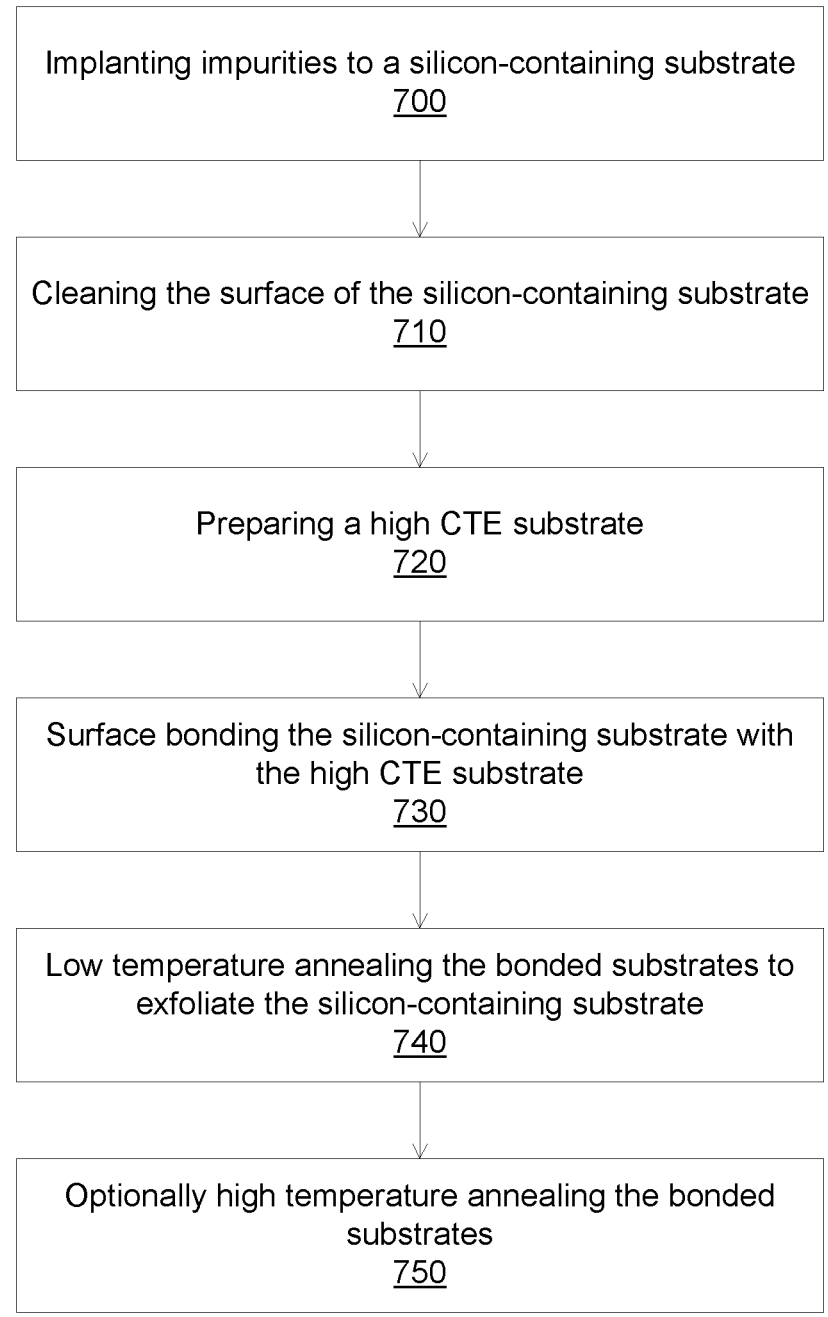
FIG. 7 illustrates a flowchart for fabricating a composite substrate according to some embodiments.

FIG. 7 illustrates a flowchart for fabricating a composite substrate according to some embodiments. A silicon-containing substrate can be prepared, such as a silicon substrate with <111> surface. Other substrates can be used, such as a germanium substrate. Operation 700 implants impurities to the silicon-containing substrate. The impurities can include hydrogen and helium. The dose of the impurities can be medium, e.g., enough to provide a defect plane of impurity without separating the surface layer. The energy of the impurities can be elected to provide a defect plane at a depth below the surface of more than 0.3, 0.5, 1, 5, 10, or 20 microns. The substrate can be a bare substrate, e.g., a silicon substrate having a bare silicon surface. The substrate can have an oxide layer on the surface, such as less than 0.1 micron, or less than 10 nm.

Operation 710 cleans the surface of the silicon-containing substrate. The cleaning can be performed in a dilute HF solution, a SC1 cleaning and/or a SC2 cleaning. In some embodiments, the cleaning process can form a surface with hydrogen or OH terminated bonds.

Operation 720 prepares a high CTE substrate. The high CTE substrate can be a glass substrate, a glass-ceramic substrate. The high CTE substrate can have a CTE value greater than silicon, such as greater than 7, 4, 5, or 6. The CTE substrate can have a flat surface, and can have a high hardness to prevent implantation species from penetrating through. The high CTE substrate can be cleaned, for example, with HF, SC1 and/or SC2. The high CTE substrate can also include oxygen elements, which can exhibit an oxide terminated surface. Also, a cleaning process can prepare the high CTE substrate to have a hydrogen or OH terminated surface.

In some embodiments, operation 720 prepares a glass or glass ceramic substrate that has CTE value equal or lower than that of silicon.

Operation 730 bonds the silicon-containing substrate surface with the high CTE substrate surface. After cleaning the surfaces of the substrates, the two substrates can be brought together, and the close proximity between the two substrates can form a surface bonding. Hydrogen or OH terminated surfaces can be responsible to the surface bonding between the two substrates.

Operation 740 anneals the bonded substrates at a low temperature to exfoliate the silicon-containing substrate. The thermal energy can coalesce the implanted impurities, forming a defect plane that can separate, e.g., exfoliate, the top portion of the surface.

Operation 750 optionally anneals the bonded substrates at a high temperature to strengthen the surface bond between the two substrates.

In some embodiments, the composite substrate can be used for forming a GaN substrate, e.g., a substrate having a layer of GaN deposited thereon.

FIGS. 8A-8C illustrate a process flow for forming a GaN substrate according to some embodiments of the present invention. In FIG. 8A, a composite substrate 800 is provided. The composite substrate can include a single crystal layer 810 such as a silicon layer disposed on a support layer 825, such as a substrate having CTE value higher than that of silicon, or a glass layer or a glass-ceramic layer. The composite substrate can be prepared by attaching a support layer on a silicon layer, such as in a process described above. In FIG. 8B, a GaN layer 840 can be deposited on the composite substrate 800. An optional buffer layer can be deposited on the composite substrate, before the deposition of the GaN layer 840. The buffer layer can serve as a lattice matching layer, to match the lattice of GaN with that of the silicon.

FIG. 8C shows a flowchart for forming a composite substrate. Operation 880 provides a composite substrate, wherein the composite substrate comprises a single crystal layer disposed on a support layer. In some embodiments, the coefficient of expansion of the support layer is higher than the coefficient of expansion of the single crystal layer. In some embodiments, the support layer can be a glass or glass ceramic substrate.

Operation 881 deposits a layer of GaN on the composite substrate. An optional buffer layer can be deposited before the deposition of the GaN layer.

In some embodiments, the composite substrates can include more than two layers. For example, a top layer of a single crystal material, a middle layer of a high CTE material, and a bottom handle layer to provide structural support. The high CTE layer can be thin, since the structural support can be handled by the handle layer.

The composite substrate can include a top layer of a single crystal material, and a layer of a glass or glass ceramic material. The glass or glass ceramic layer can be a support substrate, e.g., served to support the single crystal layer.

The composite substrate can include a top layer of a single crystal material, a middle layer of a glass or glass ceramic material, and a bottom handle layer to provide structural support. The glass or glass ceramic layer thin, such as less than 1 mm, less than 0.5 mm, less than 100 micron, or less than 50 microns. The glass or glass ceramic layer can have a flow temperature, e.g., a temperature above which the glass can be in a molten state. The glass or glass ceramic layer can have a strain temperature, e.g., a temperature above which the glass can be in a strain state for fast cooling down.

In some embodiments, the present invention discloses methods to form substrates, and substrates formed from the methods, that can be used to form GaN thin films. As discussed in the description, forming a GaN thin film on a silicon-containing layer can have face issues of lattice mismatch and thermal expansion mismatch. The lattice mismatch can be solved by the used of buffer layers, e.g., gradually transitioning from the lattice constant of the silicon-containing layer to the lattice constant of GaN.

The thermal expansion mismatch can be high, for example, due to the large difference between the CTE of silicon (about 2.6) and the CTE of GaN (about 5.6), together with the high temperature of the deposition process (about 900-1100 C). However, even with the large mismatch of CTE between silicon and GaN, large single crystal grain (e.g., 2 micron size) of GaN can be formed on silicon substrates without defects, e.g., without cracking. Further, thick films (about 3 micron thickness) of GaN can be deposited on SiC, which has a smaller different in CTE with GaN (SiC CTE of 4.2 as compared to Si CTE of 2.6). Thus a thermal mismatch of 20-30% can allow a successful growth of GaN for deposition temperatures of 900-1100 C. For lower temperatures (e.g., 600-800 C), the thermal mismatch can be even higher, e.g., 30-40%, and still can obtain crack-free GaN.

The cracking of the deposited GaN can be caused by the large thickness difference between the silicon substrates (about 700 microns) and the deposited GaN (about 2-5 microns). In some embodiments, for thin silicon substrates, such as less than 50 microns, less than 20 microns, less than 10 microns, less than 5 microns, or less than 1 micron, thick GaN can be deposited on the silicon substrates without cracking.

In some embodiments, the present invention discloses methods to deposit GaN on a silicon substrate without cracking. The methods can include forming a thin layer of silicon, and then depositing a layer of GaN on the silicon layer. The silicon layer can be thin enough to prevent cracking, and thus can be a function of the thickness of the deposited GaN. For example, the thicker the deposited GaN is, the thinner the silicon layer is. The thickness of the silicon layer can be less than 50 microns, less than 20 microns, less than 10 microns, less than 5 microns, or less than 1 micron.

In some embodiments, a composite substrate can include a silicon layer disposed on a glass or glass ceramic layer. The silicon layer can be thin, such as less than 50 microns, less than 20 microns, less than 10 microns, less than 5 microns, or less than 1 micron. The silicon layer can be exfoliated on the glass or glass ceramic layer. The glass or glass ceramic layer can have a CTE greater than that of silicon. The glass or glass ceramic layer can have a set temperature or a strain temperature lower than the deposition temperature of GaN, e.g., lower than 900, 1000, or 1100 C, such as less than 600, 700, 800, or 900 C, or any ranges in between. The set temperature or strain temperature can be the transition temperature between solid and liquid states of the glass or glass ceramic material, or a temperature above which the glass or glass ceramic material becomes molten and is flowable.

The thickness of the glass or glass ceramic layer can be such that the CTE of the composite layer, e.g., of the silicon layer on the glass or glass ceramic layer, is comparable with the CTE of GaN. In some embodiments, the comparable CTE of the composite layer can mean that GaN can be deposited on the composite layer without cracking. Since the cracking characteristic can be a function of the GaN thickness, e.g., it is easier to be cracked with thicker deposited GaN film, comparable CTE can mean different thicknesses for the glass or glass ceramic layer depending on the thickness of the deposited GaN.

In some embodiments, the comparable CTE value for the composite layer can mean that the CTE of the composite layer can be similar to the CTE of GaN, e.g., the absolute value of the difference between the CTE of the composite layer and the CTE of GaN can be less than 30%, less than 20%, less than 10%, or less than 5% of the CTE of GaN or of the CTE of the composite layer.

In some embodiments, the comparable CTE value for the composite layer can mean that the CTE of the composite layer can be greater than the CTE of silicon, and between 0.7 and 1 (e.g., less than the CTE of GaN and greater than 70% of the CTE of GaN), between 0.8 and 1 (e.g., less than the CTE of GaN and greater than 80% of the CTE of GaN), between 0.9 and 1 (e.g., less than the CTE of GaN and greater than 90% of the CTE of GaN), or between 0.95 and 1 (e.g., less than the CTE of GaN and greater than 95% of the CTE of GaN) of the CTE of GaN. Since with 50% difference in CTE mismatch can allow a deposition of GaN for 2 micron grain sizes, less than 30%, 20%, 10%, or 5% difference can result in a crack-free GaN film. The lower CTE for the composite layer can mean a thinner glass or glass ceramic layer, which can be beneficial for the formation of the composite layer, such as lower cost.

In operation, the composite layer can be heated to the deposition temperature of GaN. Passing the set or strain temperature of the glass or glass ceramic layer, the glass or glass ceramic layer can reflow, relaxing the stress or strain of the silicon layer. Thus at the deposition temperature, the silicon can have no constraint, and the GaN and the silicon can reach an equilibrium regarding lattice expansion.

After the deposition process, the temperature can be cooled down. Before reaching the set or strain temperature, the glass or glass ceramic layer is still in the molten state, thus has little effect on the GaN on silicon multilayer. Below the set or strain temperature, the glass or glass ceramic layer is solidified. The composite layer of glass or glass ceramic layer and silicon can have a comparable CTE with GaN, thus there can be no crack on the GaN, especially at the set or strain temperature, which is lower than the deposition temperature.

In some embodiments, a handle substrate can be included to support the composite layer of glass or glass ceramic layer and silicon layer. For example, since the glass or glass ceramic layer and the silicon layer can be thin, the handle substrate can provide rigidity during the handling of the composite layer in the deposition process. The thickness of the glass or glass ceramic layer can be less than 200 microns, less than 100 microns, less than 50 microns, less than 20 microns, or less than 10 microns. The exact thickness can be determined from the comparable CTE, e.g., a thickness that can provide a comparable CTE with GaN, e.g., a CTE so that the GaN does not crack at room temperature, for example, a CTE that is within 30, 20, or 10% of the CTE of GaN, or a CTE that is less than the CTE of GaN but greater than 0.7, 0.8, 0.9, or 0.95 of the CTE of GaN.

Figure 9A:
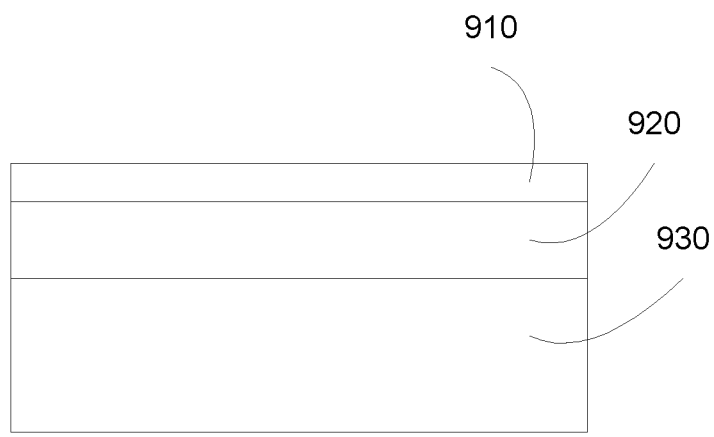
FIGS. 9A-9B illustrate various composite substrate configurations according to some embodiments.
Figure 9B:
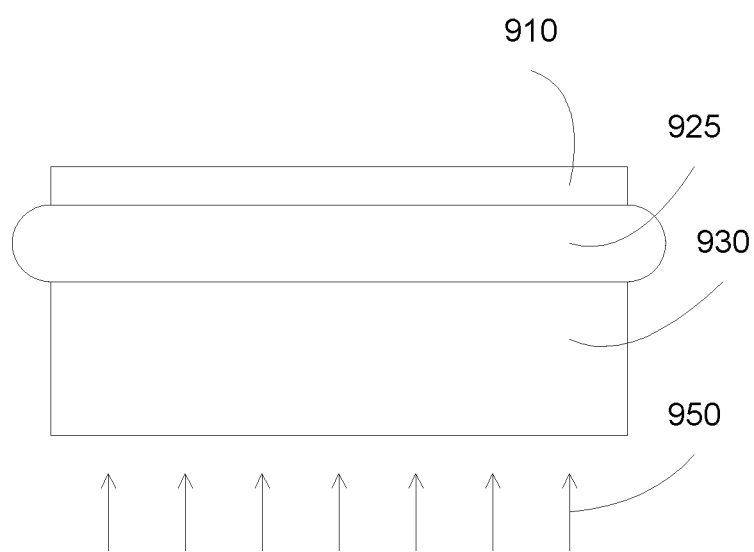

FIGS. 9A-9B illustrate various composite substrate configurations according to some embodiments. In FIG. 9A, a single crystal layer 910 is disposed on a high CTE layer 920 on a handle substrate 930. The single crystal layer 910 can be a silicon layer, or a silicon-containing layer, such as silicon carbide or silicon germanium, or a germanium layer. The thickness of the single crystal layer can be less than 5 microns, less than 1 micron, or less than 0.5 micron.

The layer 920 can include a glass or a glass-ceramic layer or a layer having high CTE values, e.g., higher than silicon. For example, the CTE value of the high CTE layer 920 can be greater than about 3, such as between 4 and 7 for a glass or glass-ceramic. The thickness of the high CTE layer can be configured to form a composite substrate (e.g., combined with the single crystal layer 910) that has a comparable CTE with LED materials such as GaN. For medium CTE values, e.g., between 3 and 7, the thickness of the high CTE layer can be more than 50 microns, more than 100 microns, or more than 200 microns. For high CTE values, e.g., higher than 5, the thickness of the high CTE layer can be more than the thickness of the thinner layer 110, such as more than 1 micron, more than 5 microns, more than 10 microns, or more than 20 microns.

The handle substrate 930 can be any substrate, such as a silicon substrate.

In FIG. 9B, a single crystal layer 910 is disposed on a layer 925, which can be a glass or a glass-ceramic layer or a layer having high CTE values, on a handle substrate 930. The high CTE layer 925 can include a glass layer or a glass ceramic layer. For example, the high CTE layer can have a lower melting temperature, e.g., lower than the deposition temperature of GaN, which is about 1000-1100 C. The high CTE layer 925 can have a melting or reflow temperature of 600-900 C, such as 650 to 750 C of glass or glass ceramic material. Thus for high temperature anneal 950, the high CTE layer can reflowed, e.g., in a molten state so that the single crystal layer 910 can be relaxed. This low temperature reflow characteristic can reduce the stress or strain associated with a GaN deposited on the single crystal layer 910, since at the reflow temperature, the high CTE layer becomes molten, and can release associated stress related to the bottom of the single crystal layer. In other words, the thermal expansion of the single crystal layer, and the GaN deposited thereon, can be considered up to the reflow temperature (e.g., 600-900 C), instead of the actual processing temperature (e.g., 1000-1100 C).

The high CTE layer can include a glass layer. The glass layer can be relatively thick compared to oxide layers normally formed on the silicon substrates by thermal oxidation or by deposition. Thickness of 0.5 mm to 3 mm can be used because these thicknesses are available as freestanding glass sheets from major commercial glass suppliers. The glass layer can have strain point significantly lower than that of pure silicon oxide layers. The glass layer can have CTE value close but higher than that of silicon to its strain point. For example, the CTE of the glass layer can be in the range from 3 ppm/C to 6 ppm/C.

These three factors related to the glass layer of this structure can lead to significantly lower the tensile stress in the gallium nitride grown during cooling from GaN growth temperature. This can allow growing crack-free gallium nitride layers exceeding 3 microns or more.

In some embodiments, the silicon handle layer can also serve to constrain the softened glass layer or glass-ceramic layer at the GaN growth temperature of 1100 C, due to surface tension forces, and to keep the composite substrate flat at all temperatures.

In some embodiments, the handle substrate can be silicon substrates with any orientation. The handle substrate can also be poly-crystalline silicon substrate, or poly-crystalline oxidized silicon carbide, aluminum nitride or other oxide ceramics that are refractory (withstand 1100 C), and have CTE in the range of 3-6 ppm/C, and to which the glass wets.

The composite substrate can have the benefits of thin silicon, which reduces defects, such as misfit dislocations, during growth, and the benefit of thick glass bonding layer, which can allow growing thicker crack-free layers. The composite substrate can allow better LED devices with lower costs.

FIGS. 10A-10F illustrate a process for forming a composite substrate according to some embodiments. In FIG.

10A, a substrate 1010 can be provided. The substrate can be a single crystal substrate. For example, the substrate can be a silicon substrate, or a silicon containing substrate, such as silicon germanium or silicon carbide substrate. The surface lattice of the substrate 1010 can be selected to be close to that of GaN for LED device fabrication. For example, the substrate can be a <111> silicon substrate. Other substrates can be used, such as germanium substrates.

The substrate 1010 can be implanted 1040 with an implantation species such as hydrogen or helium. The energy of the implantation species can be configured to form a layer of defects 1045 in the substrate 1010.

Figure 10A:
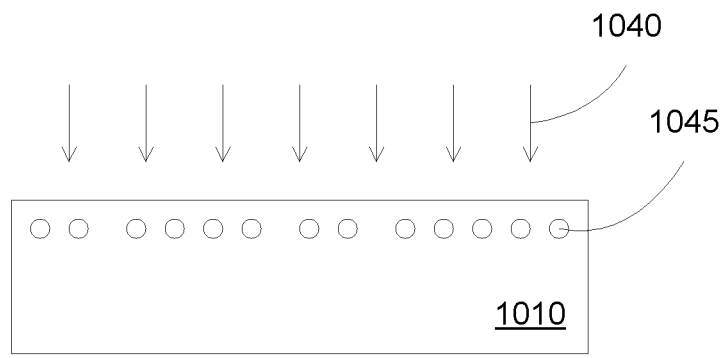
FIGS. 10A-10F illustrate a process for forming a composite substrate according to some embodiments.
Figure 10B:
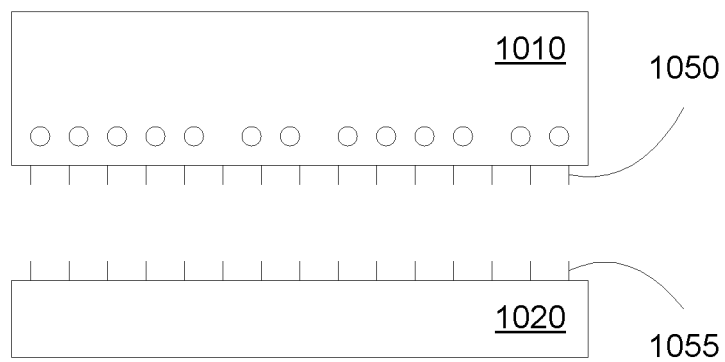

In FIG. 10B, the substrate 1010 can be prepared for a bonding process with a substrate 1020, which can be a glass or a glass-ceramic layer or a layer having high CTE values. For example, the substrates 1010 and 1020 can be cleaned in a wet cleaning process. The substrates can have a thin oxide grown on the surface, for example, by a plasma oxidation or a furnace oxidation process. After a cleaning process, the two substrates can have a clean surface, such as a hydrogen or OH terminated surface 1050, 1055. The clean surface 1050 and 1055 can facilitate the bonding between the substrates 1010 and 1020.

In some embodiments, the high CTE substrate can be a glass plate having thickness between 0.5 and 3 mm. The glass can include Corning LCD glass, CODE 1737 F, and Corning Willow Glass. Other commercial glass makers, Asahi and Schott can be used. These glasses can have the desired properties of appropriate CTE, and T-strain, and can have the advantages of low costs, easy availability and highly reproducible properties, together with being manufactured in large volumes.

Figure 10C:
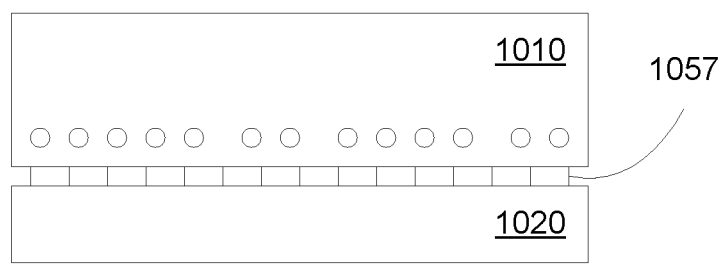

In FIG. 10C, after cleaning, the substrates can be brought together for a contact bonding. The substrates can be flat and clean, and when brought together in intimate contact, can form contact bonding 1057. Hydrogen or OH terminated surfaces can be used to explain the bonds between the two substrates. In some embodiments, the substrate 1010 can be a silicon substrate, which can be very flat and free of defects, after a cleaning process, such as an HF cleaning, SC1 clean ($H_2O_2+NH_4OH$) for organic contamination removal, and/or SC2 clean ($H_2O_2+H_2SO_4$) for ionic and metal contamination removal. The substrate 1020 can also be flat and free of defects. The substrate 1020 can include a glass substrate, a glass-ceramic substrate, which are flat, cleaned and have high CTE values.

Figure 10D:
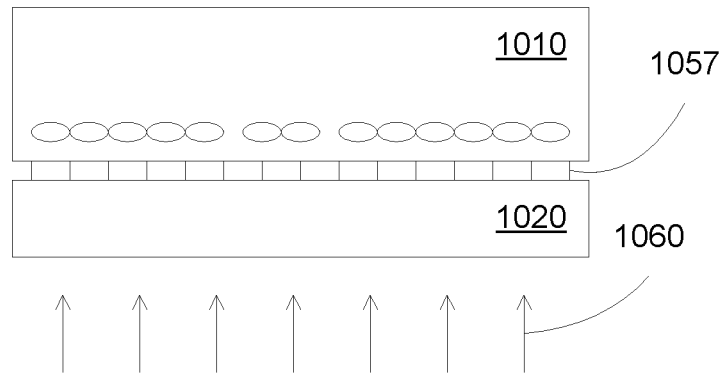

In FIG. 10D, the two substrates 1010 and 1020 can be subjected to a low temperature anneal 1060, e.g., less than about 600 C, such as between 400 and 1000 C. The thermal energy from the anneal process can coalesce the implantation species, forming a continuous defect layer that can separate the top portion of the substrate 1010 from the body portion. The implantation species can migrate laterally to form a defect plane if prohibited from moving vertically to the surface. Thus the bond between the two substrate surfaces can be configured to provide an intimate contact, to prevent the implantation species from escape. Further, the substrate 1020 can form a solid surface, which can also prevent the implantation species from penetrating the substrate 1020.

Figure 10E:
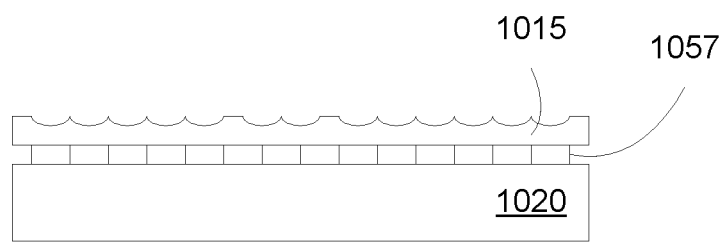
Figure 10F:
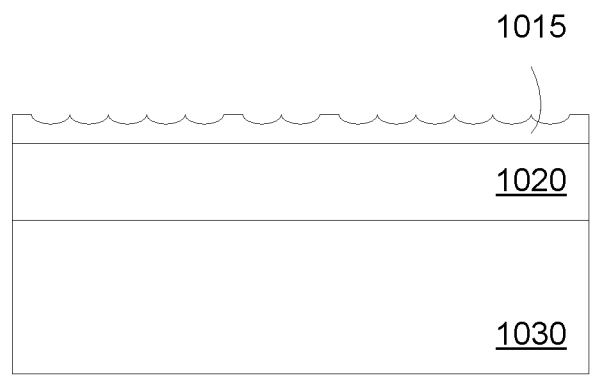

In FIG. 10E, the top surface layer 1015 of the substrate 1010 can be exfoliated, for example, at the defect plane formed by the implantation species. In FIG. 10F, a handle substrate 1030 can be coupled to the backside of the high CTE layer 1020. The composite substrate can undergo an optional high temperature anneal can be performed, solidly bonding the top surface layer 1015 to the high CTE layer 1020, and the high CTE layer 1020 to the handle substrate 1030.

Figure 11:
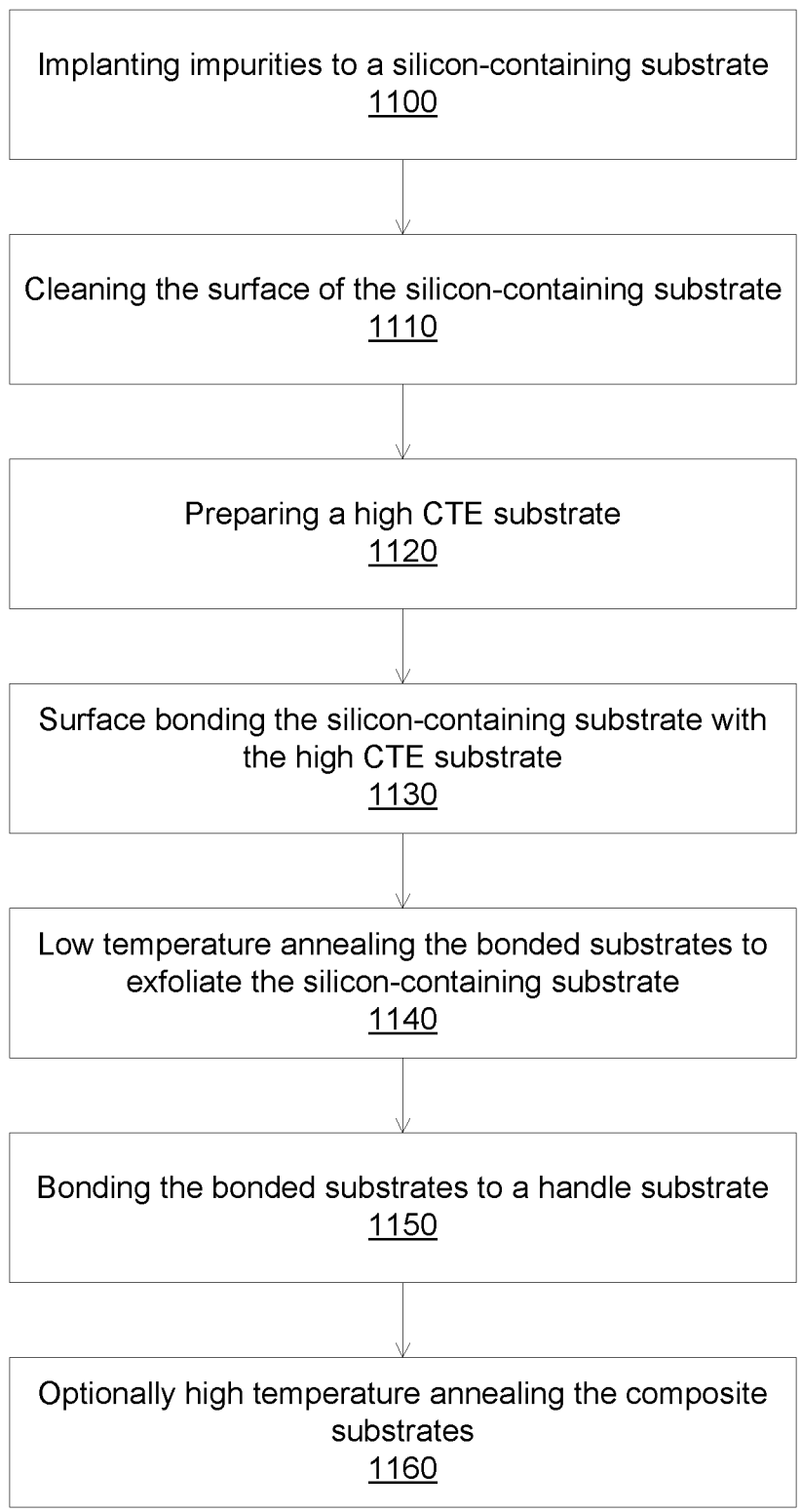
FIG. 11 illustrates a flowchart for fabricating a composite substrate according to some embodiments

FIG. 11 illustrates a flowchart for fabricating a composite substrate according to some embodiments. A silicon-containing substrate can be prepared, such as a silicon substrate with <111> surface. Other substrates can be used, such as a germanium substrate. Operation 1100 implants impurities to the silicon-containing substrate. The impurities can include hydrogen and helium. The dose of the impurities can be medium, e.g., enough to provide a defect plane of impurity without separating the surface layer. The energy of the impurities can be elected to provide a defect plane at a depth below the surface of more than 0.3, 0.5, 1, 5, 10, or 20 microns. The substrate can be a bare substrate, e.g., a silicon substrate having a bare silicon surface. The substrate can have an oxide layer on the surface, such as less than 0.1 micron, or less than 10 nm.

Operation 1110 cleans the surface of the silicon-containing substrate. The cleaning can be performed in a dilute HF solution, a SC1 cleaning and/or a SC2 cleaning. In some embodiments, the cleaning process can form a surface with hydrogen or OH terminated bonds.

Operation 1120 prepares a substrate, which can be glass or a glass-ceramic layer or a layer having high CTE value. The high CTE substrate can be a glass substrate, a ceramic substrate such as aluminum oxide, or a composite substrate of multiple layers. The high CTE substrate can have a CTE value greater than silicon, such as greater than 11, 4, 5, or 11. The CTE substrate can have a flat surface, and can have a high hardness to prevent implantation species from penetrating through. The high CTE substrate can be cleaned, for example, with HF, SC1 and/or SC2. The high CTE substrate can also include oxygen elements, which can exhibit an oxide terminated surface. Also, a cleaning process can prepare the high CTE substrate to have a hydrogen or OH terminated surface.

Operation 1130 bonds the silicon-containing substrate surface with the high CTE substrate surface. After cleaning the surfaces of the substrates, the substrates can be brought together, and the close proximity between the substrates can form a surface bonding. Hydrogen or OH terminated surfaces can be responsible to the surface bonding between the two substrates.

Operation 1140 anneals the bonded substrates at a low temperature to exfoliate the silicon-containing substrate. The thermal energy can coalesce the implanted impurities, forming a defect plane that can separate, e.g., exfoliate, the top portion of the surface.

Operation 1150 bonds a handle substrate to a backside of the high CTE layer. Operation 1160 optionally anneals the bonded substrates at a high temperature to strengthen the surface bond between the three substrates.

Figure 12A:
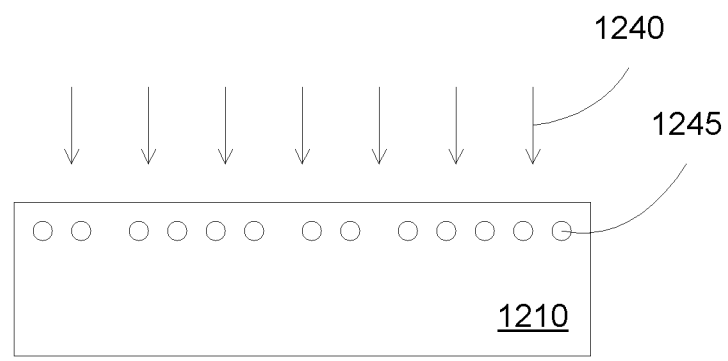
FIGS. 12A-12F illustrate a process for forming a composite substrate according to some embodiments.

FIGS. 12A-12F illustrate a process for forming a composite substrate according to some embodiments. In FIG. 12A, a substrate 1210 can be provided. The substrate can be a single crystal substrate. For example, the substrate can be a silicon substrate, or a silicon containing substrate, such as silicon germanium or silicon carbide substrate. The surface lattice of the substrate 1210 can be selected to be close to that of GaN for LED device fabrication. For example, the substrate can be a <111> silicon substrate. Other substrates can be used, such as germanium substrates.

The substrate 1210 can be implanted 1240 with an implantation species such as hydrogen or helium. The energy of the implantation species can be configured to form a layer of defects 1245 in the substrate 1210.

Figure 12B:
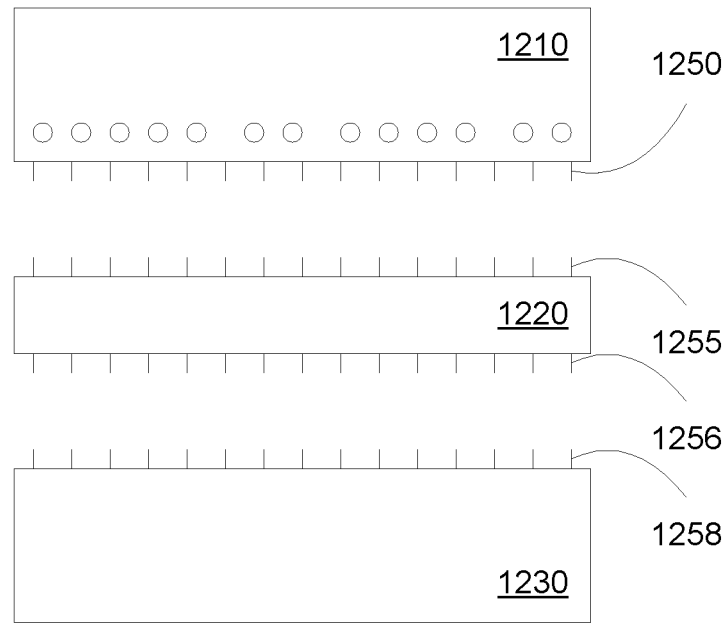

In FIG. 12B, the substrate 1210 can be prepared for a bonding process with a substrate 1220 (which can be glass or a glass-ceramic substrate or a high CTE substrate, e.g., a substrate having CTE value greater than that of silicon) and a handle substrate 1230. For example, the substrates 1210, 1220 and 1230 can be cleaned in a wet cleaning process. The substrates can have a thin oxide grown on the surface, for example, by a plasma oxidation or a furnace oxidation process. After a cleaning process, the three substrates can have a clean surface, such as a hydrogen or OH terminated surface 1250, 1255, 1256, and 1258. The clean surface 1250, 1255, 1256, and 1258 can facilitate the bonding between the substrates 1210, 1220, and 1230.

Figure 12C:
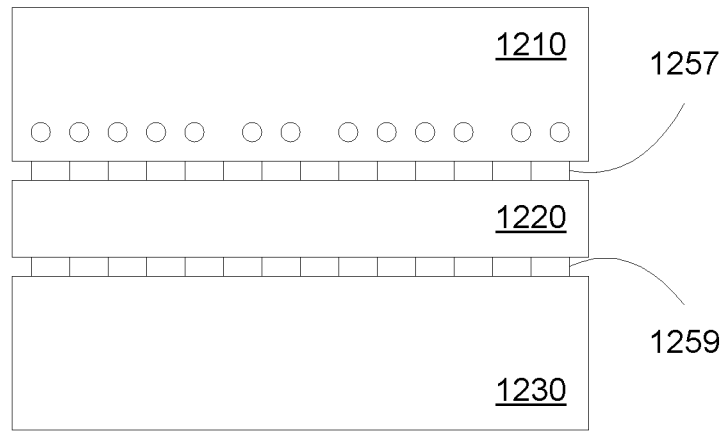

In FIG. 12C, after cleaning, the substrates can be brought together for a contact bonding. The substrates can be flat and clean, and when brought together in intimate contact, can form contact bonding 1257 and 1259. Hydrogen or OH terminated surfaces can be used to explain the bonds between the two substrates. In some embodiments, the substrates 1210 and 1230 can be silicon substrates, which can be very flat and free of defects, after a cleaning process, such as an HF cleaning, SC1 clean ($H_2O_2+NH_4OH$) for organic contamination removal, and/or SC2 clean ($H_2O_2+H_2SO_4$) for ionic and metal contamination removal. The substrate 1220 can also be flat and free of defects. The substrate 1220 can include a glass substrate, a glass-ceramic substrate, which are flat, cleaned and have high CTE values.

Figure 12D:
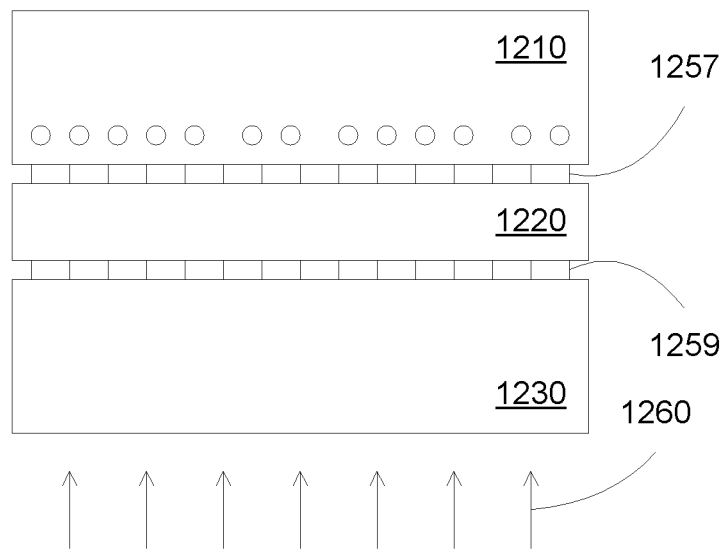

In FIG. 12D, the composite substrate, e.g., three substrates 1210, 1220 and 1230, can be subjected to a low temperature anneal 1260, e.g., less than about 600 C, such as between 400 and 1200 C. The thermal energy from the anneal process can coalesce the implantation species, forming a continuous defect layer that can separate the top portion of the substrate 1210 from the body portion. The implantation species can migrate laterally to form a defect plane if prohibited from moving vertically to the surface. Thus the bond between the two substrate surfaces can be configured to provide an intimate contact, to prevent the implantation species from escape. Further, the substrate 1220 can form a solid surface, which can also prevent the implantation species from penetrating the substrate 1220.

Figure 12E:
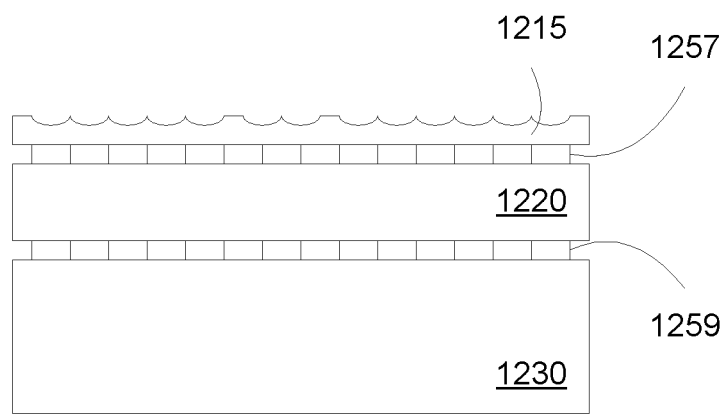
Figure 12F:
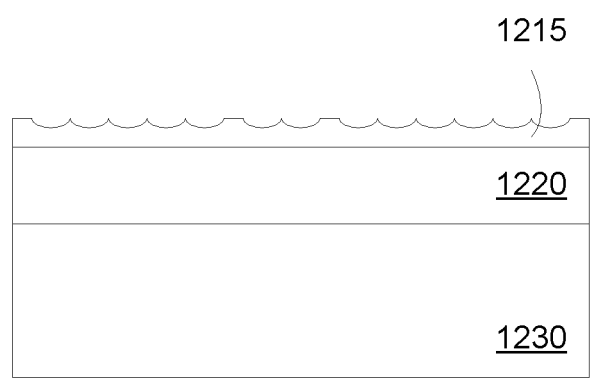

In FIG. 12E, the top surface layer 1215 of the substrate 1210 can be exfoliated, for example, at the defect plane formed by the implantation species. In FIG. 12F, the composite substrate can undergo an optional high temperature anneal can be performed, solidly bonding the top surface layer 1215 to the high CTE layer 1220, and the high CTE layer 1220 to the handle substrate 1230.

Figure 13:
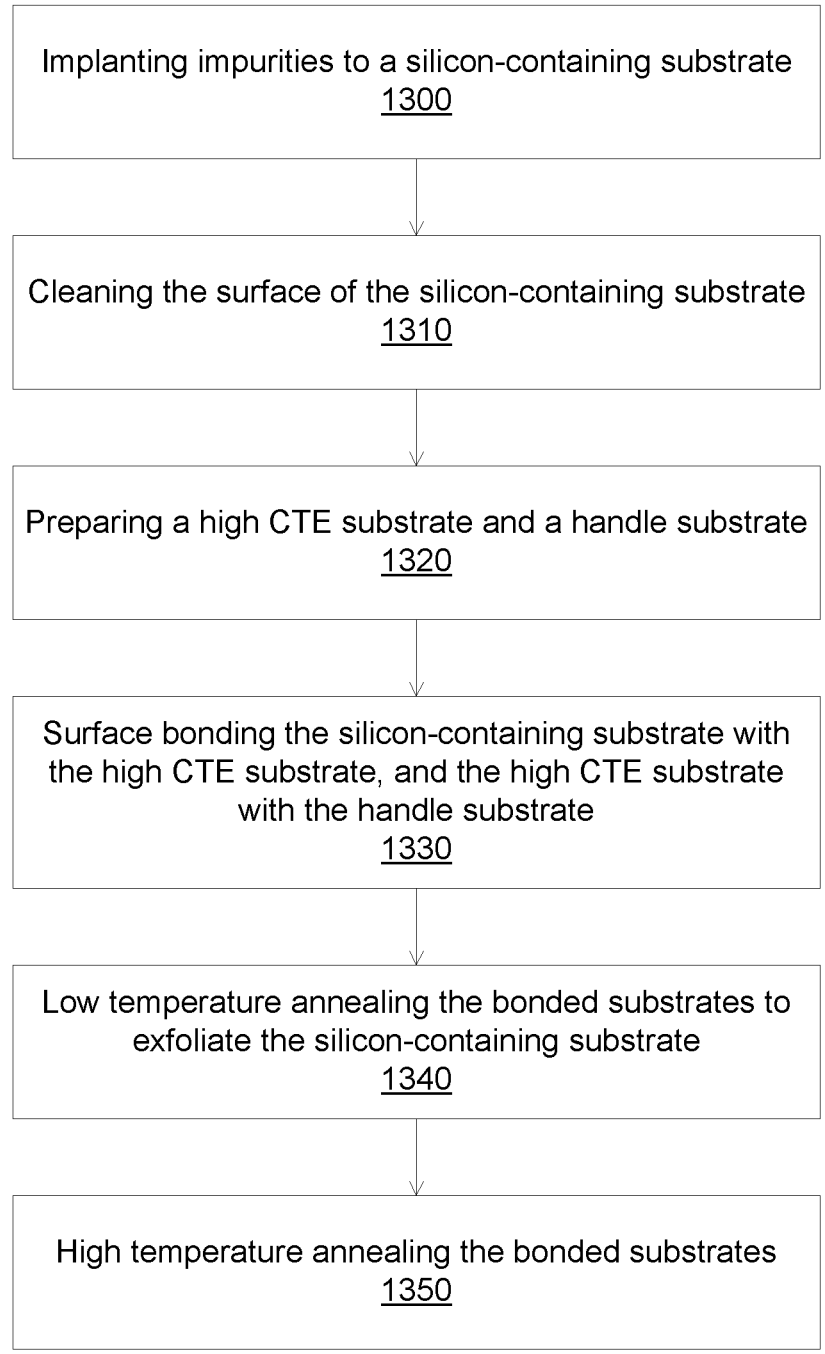
FIG. 13 illustrates a flowchart for fabricating a composite substrate according to some embodiments.

FIG. 13 illustrates a flowchart for fabricating a composite substrate according to some embodiments. A silicon-containing substrate can be prepared, such as a silicon substrate with <111> surface. Other substrates can be used, such as a germanium substrate. Operation 1300 implants impurities to the silicon-containing substrate. The impurities can include hydrogen and helium. The dose of the impurities can be medium, e.g., enough to provide a defect plane of impurity without separating the surface layer. The energy of the impurities can be elected to provide a defect plane at a depth below the surface of more than 0.3, 0.5, 1, 5, 10, or 20 microns. The substrate can be a bare substrate, e.g., a silicon substrate having a bare silicon surface. The substrate can have an oxide layer on the surface, such as less than 0.1 micron, or less than 10 nm.

Operation 1310 cleans the surface of the silicon-containing substrate. The cleaning can be performed in a dilute HF solution, a SC1 cleaning and/or a SC2 cleaning. In some embodiments, the cleaning process can form a surface with hydrogen or OH terminated bonds.

Operation 1320 prepares a substrate (which can be glass or a glass-ceramic substrate or a high CTE substrate, e.g., a substrate having CTE value greater than that of silicon). The high CTE substrate can be a glass substrate, a glass-ceramic substrate having set points ranging from 600 C-900 C. The high CTE substrate can have a CTE value greater than silicon, such as greater than 13, 4, 5, or 13. The CTE substrate can have a flat surface, and can have a high hardness to prevent implantation species from penetrating through. The high CTE substrate can be cleaned, for example, with HF, SC1 and/or SC2. The high CTE substrate can also include oxygen elements, which can exhibit an oxide terminated surface. Also, a cleaning process can prepare the high CTE substrate to have a hydrogen or OH terminated surface.

Operation 1330 bonds the silicon-containing substrate surface with the high CTE substrate surface, and the high CTE substrate surface with the handle substrate. After cleaning the surfaces of the substrates, the substrates can be brought together, and the close proximity between the two substrates can form a surface bonding. Hydrogen or OH terminated surfaces can be responsible to the surface bonding between the substrates.

Operation 1340 anneals the bonded substrates at a low temperature to exfoliate the silicon-containing substrate. The thermal energy can coalesce the implanted impurities, forming a defect plane that can separate, e.g., exfoliate, the top portion of the surface.

Operation 1350 optionally anneals the bonded substrates at a high temperature to strengthen the surface bond between the three substrates.

Figure 14A:
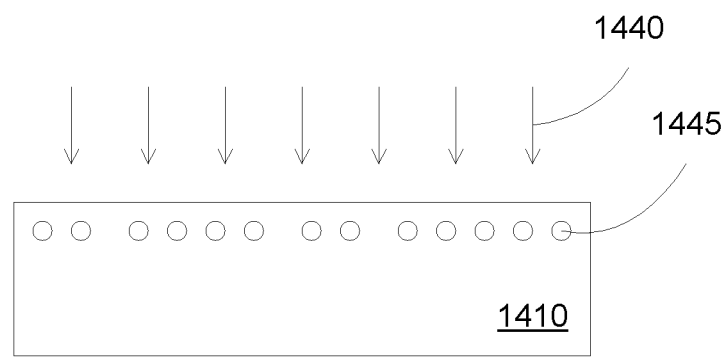
FIGS. 14A-14E illustrate another process for forming a composite substrate according to some embodiments.

FIGS. 14A-14E illustrate another process for forming a composite substrate according to some embodiments. In FIG. 14A, a substrate 1410 can be provided. The substrate can be a single crystal substrate. For example, the substrate can be a silicon substrate, or a silicon containing substrate, such as silicon germanium or silicon carbide substrate. The surface lattice of the substrate 1410 can be selected to be close to that of GaN for LED device fabrication. For example, the substrate can be a <111> silicon substrate. Other substrates can be used, such as germanium substrates.

The substrate 1410 can be implanted 1440 with an implantation species such as hydrogen or helium. The energy of the implantation species can be configured to form a layer of defects 1445 in the substrate 1410.

Figure 14B:
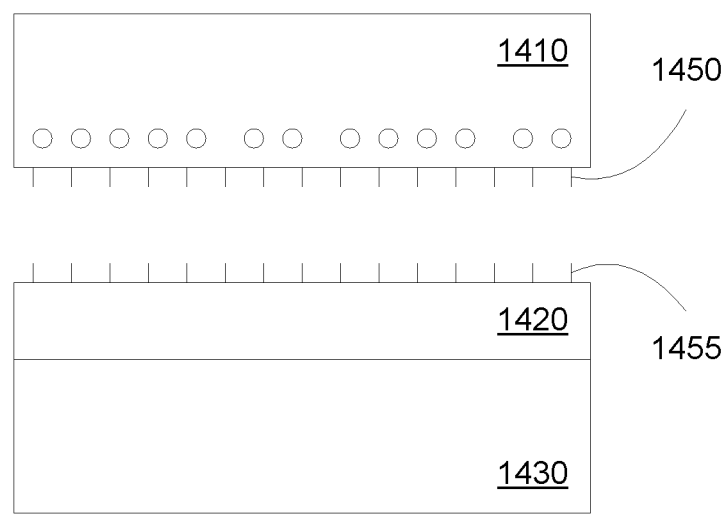

In FIG. 14B, the substrate 1410 can be prepared for a bonding process with a layer 1420 (which can be glass or a glass-ceramic substrate or a high CTE substrate, e.g., a substrate having CTE value greater than that of silicon). The high CTE layer can be formed, e.g., deposited, on a handle substrate 1430. The handle substrate 1430 can be a silicon containing substrate, and the high CTE layer can be deposited on the substrate 1430. For example, the high CTE substrate can be a glass substrate, a glass-ceramic substrate, having set points ranging from 600 C-900 C, which can have high CTE values. The layer can facilitate the bonding of the high CTE layer with the substrate 1410.

Alternatively, the high CTE layer can include a glass-ceramic layer. The substrates 1410 and 1430 can be cleaned in a wet cleaning process. The substrates can have a thin oxide grown on the surface, for example, by a plasma oxidation or a furnace oxidation process. After a cleaning process, the two substrates can have a clean surface, such as a hydrogen or OH terminated surface 1450, 1455. The clean surface 1450 and 1455 can facilitate the bonding between the substrates 1410 and 1430.

Figure 14C:
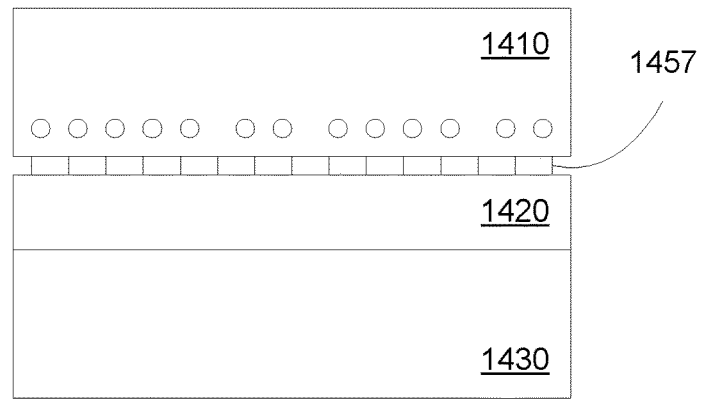

In FIG. 14C, after cleaning, the substrates can be brought together for a contact bonding. The substrates can be flat and clean, and when brought together in intimate contact, can form contact bonding 1457. Hydrogen or OH terminated surfaces can be used to explain the bonds between the two substrates. In some embodiments, the substrate 1410 can be a silicon substrate, which can be very flat and free of defects, after a cleaning process, such as an HF cleaning, SC1 clean ($H_2O_2+NH_4OH$) for organic contamination removal, and/or SC2 clean ($H_2O_2+H_2SO_4$) for ionic and metal contamination removal. The substrate 1430 can also be flat and free of defects. The substrate 1430 can include a silicon substrate, or any other substrates.

Figure 14D:
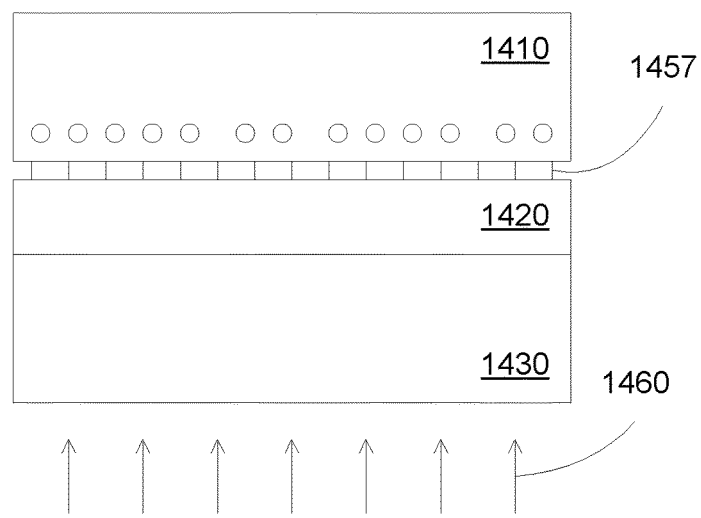

In FIG. 14D, the two substrates 1410 and 1430 can be subjected to a low temperature anneal 1460, e.g., less than about 600 C, such as between 400 and 900 C. The thermal energy from the anneal process can coalesce the implantation species, forming a continuous defect layer that can separate the top portion of the substrate 1410 from the body portion. The implantation species can migrate laterally to form a defect plane if prohibited from moving vertically to the surface. Thus the bond between the two substrate surfaces can be configured to provide an intimate contact, to prevent the implantation species from escape. Further, the substrate 1430 can form a solid surface, which can also prevent the implantation species from penetrating the substrate 1430.

Figure 14E:
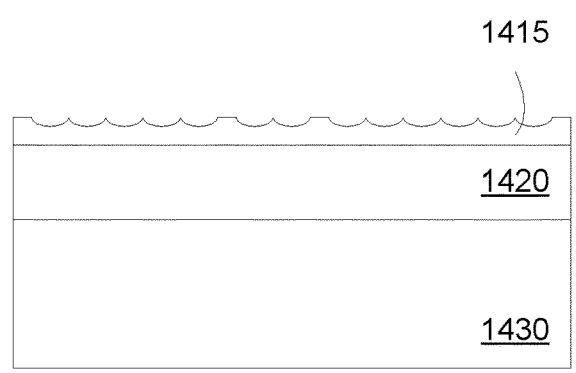

In FIG. 14E, the top surface layer 1415 of the substrate 1410 can be exfoliated, for example, at the defect plane formed by the implantation species. The composite substrate can undergo an optional high temperature anneal can be performed, solidly bonding the top surface layer 1415 to the high CTE layer 1420.

Figure 15:
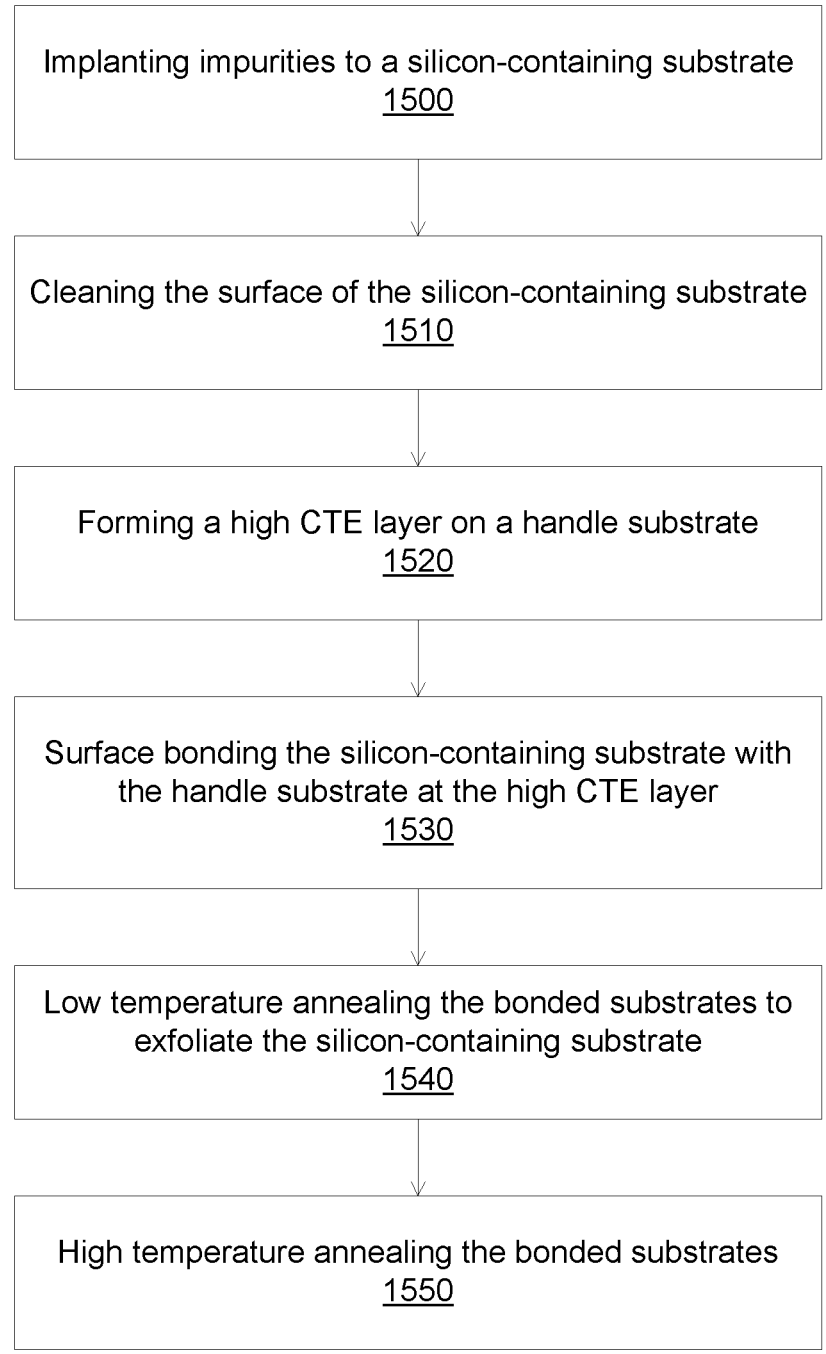
FIG. 15 illustrates a flowchart for fabricating a composite substrate according to some embodiments.

FIG. 15 illustrates a flowchart for fabricating a composite substrate according to some embodiments. A silicon-containing substrate can be prepared, such as a silicon substrate with <111> surface. Other substrates can be used, such as a germanium substrate. Operation 1500 implants impurities to the silicon-containing substrate. The impurities can include hydrogen and helium. The dose of the impurities can be medium, e.g., enough to provide a defect plane of impurity without separating the surface layer. The energy of the impurities can be elected to provide a defect plane at a depth below the surface of more than 0.3, 0.5, 1, 5, 10, or 20 microns. The substrate can be a bare substrate, e.g., a silicon substrate having a bare silicon surface. The substrate can have an oxide layer on the surface, such as less than 0.1 micron, or less than 10 nm.

Operation 1510 cleans the surface of the silicon-containing substrate. The cleaning can be performed in a dilute HF solution, a SC1 cleaning and/or a SC2 cleaning. In some embodiments, the cleaning process can form a surface with hydrogen or OH terminated bonds.

Operation 1520 forming a high CTE layer on a handle substrate. The high CTE substrate can be a glass substrate, a glass-ceramic substrate, having set points ranging from 600 C-900 C. The high CTE layer can have a CTE value greater than silicon, such as greater than 4, 5, or 10. The CTE layer can have a flat surface, and can have a high hardness to prevent implantation species from penetrating through. The high CTE layer can be cleaned, for example, with HF, SC1 and/or SC2. The high CTE layer can also include oxygen elements, which can exhibit an oxide terminated surface. Also, a cleaning process can prepare the high CTE layer to have a hydrogen or OH terminated surface.

Operation 1530 bonds the silicon-containing substrate surface with the high CTE surface of the handle substrate. After cleaning the surfaces of the substrates, the substrates can be brought together, and the close proximity between the substrates can form a surface bonding. Hydrogen or OH terminated surfaces can be responsible to the surface bonding between the two substrates.

Operation 1540 anneals the bonded substrates at a low temperature to exfoliate the silicon-containing substrate. The thermal energy can coalesce the implanted impurities, forming a defect plane that can separate, e.g., exfoliate, the top portion of the surface.

Operation 1550 optionally anneals the bonded substrates at a high temperature to strengthen the surface bond between the three substrates.

In some embodiments, the present invention discloses methods and systems to form GaN on a silicon substrate. Difficulties in depositing GaN on silicon substrates include lattice mismatch during the epitaxial growth of the GaN layer on the single crystal silicon substrate. The lattice mismatch can be about 17%, which can lead to extensive threading dislocations during the GaN growth, which can lead to poor GaN quality. The lattice mismatch can be addressed using numerous methods, such as GaN growth on buffer layers, or growing thicker (~5 mm) GaN layer.

Another difficulty in the deposition of GaN on silicon substrates is the thermal expansion mismatch of about 50% during the cooling down process from the deposition temperature to room temperature. The mismatch in thermal expansion can cause thick GaN layers to experience high expansion. For example, GaN layer deposited on silicon wafer can experience the most of the thermal expansion, since the thickness of the silicon can be 200 microns with the thickness of the GaN is in order on 1 micron. Further, GaN can be too resistive due to high dislocation density. Thus, GaN layer thicker than 2 microns can show cracks in the GaN layer when cooling down to room temperature.

In some embodiments, the present invention discloses methods and systems for depositing GaN layers on silicon SOI substrates while preserving the proven improvements of GaN quality. The deposited GaN layers can experience ~40% reduced stress in GaN over bare silicon case, which can lead to crack-free GaN for GaN layer thicker than 5 microns.

Other advantages of the present invention can include compatibility with 200 mm CMOS fabrication facilities, ease of processing than for SOI, easy to scale—size and volume, using known and readily available materials, ease of separation from the substrate, and potential lower cost than sapphire.

In some embodiments, the present invention discloses methods and systems for growing GaN on silicon layer, using a thicker and softer glass-like layer (e.g., glass or glass-ceramic layer). The glass-like layer can have a set point or set temperature which can be viewed as the transition temperature between solid and liquid states of a glass. Actually, there is no single temperature above which a glass acts essentially as a liquid (shear stresses release instantaneously) and below which a glass acts essentially as a solid (no significant stress release). As temperatures change, glass states gradually change between solid and liquid states. For example, when temperatures increase, glass can gradually change from solid state to molten state before reaching liquid state.

In some embodiments, by using a composite substrate having a glass layer in between, the glass layer can reduce any thermal expansion mismatch between silicon and GaN when the temperature reaches the set point, e.g., when the glass becomes molten and is flowable.

Figure 16A:
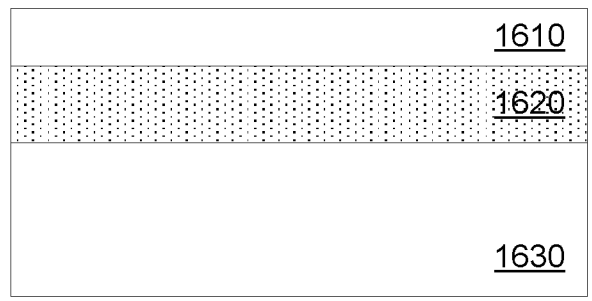
FIGS. 16A-16F illustrate a process for depositing a GaN on a composite substrate according to some embodiments.

FIGS. 16A-16F illustrate a process for depositing a GaN on a composite substrate according to some embodiments. In FIG. 16A, a composite substrate can be provided. The composite substrate can include a single crystal layer 1610, which is disposed on a glass or glass-ceramic layer 1620, which is disposed on a handle or support substrate 1630. The single crystal layer can include a single crystal silicon layer, or a silicon-containing layer. The single crystal layer can be less than 20 microns, less than 10, 5 2 or 1 micron. The single crystal layer can be formed on the glass or glass ceramic substrate by exfoliation as discussed above.

The glass or glass ceramic layer can have a set point less than the deposition temperature of GaN, which is about 1100 C. For example, the glass or glass ceramic layer can become molten, e.g., flowable, at a temperature between 600 and 1000 C, or between 600 and 800 C, such as about 670 C. The glass or glass ceramic layer can have a CTE between $4 \times 10^{-7}/°$ C. and $7 \times 10^{-7}/°$ C.

The glass or glass ceramic layer can have a strain point less than the deposition temperature of GaN. For example, the glass or glass ceramic layer can become strained when cooling from the set point to the strain point is in order of minutes and not in order of hours. The strain point can be between 300 and 800 C, or between 400 and 600 C.

Figure 16B:
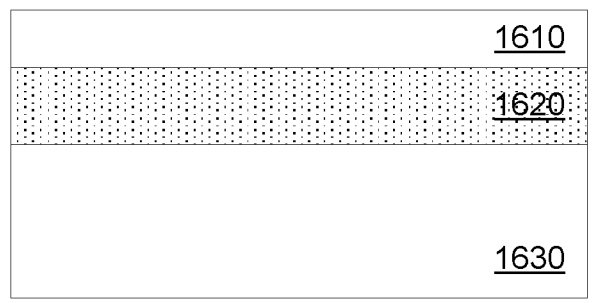

In FIG. 16B, the composite substrate is heated to the set point of the glass or glass ceramic layer, which is less than the deposition temperature of GaN (1100 C). The set point can be viewed as the temperature at which the glass or glass ceramic substrate becomes flowable, e.g., a molten state. For example, the composite substrate can be brought to a deposition chamber, placed on a deposition chuck, which is capable to heating to the GaN deposition temperature. The set point can be between 600 and 1000 C, or between 600 and 800 C, depending on the composition of the glass, such as about 670 C for LCD substrates from Corning Glass.

The molten state of the glass or glass ceramic layer can relax the bonding between the silicon layer and the support layer. For example, the support layer, the glass layer, and the silicon layer can be bonded at a room temperature. When the composite substrate is heated, the layers can expand at different rates, depending on their expansion coefficients. Thus there can be stress and strain on the layers.

When the temperature reaches the set point (e.g., when the glass or glass ceramic layer becomes molten), the silicon layer can relax, and the lattice constant of the silicon layer can have stress free, since the layer is disposed on a semiliquid layer. In contrast, without the molten glass layer, the silicon layer would have some stress or strain, depending on the CTE of the underlayer such as the support layer.

In some embodiments, the composite substrate can be held at the set point for a time period, for example, to allow the silicon layer to relax, e.g., reaching a minimum stress or strain condition.

Figure 16C:
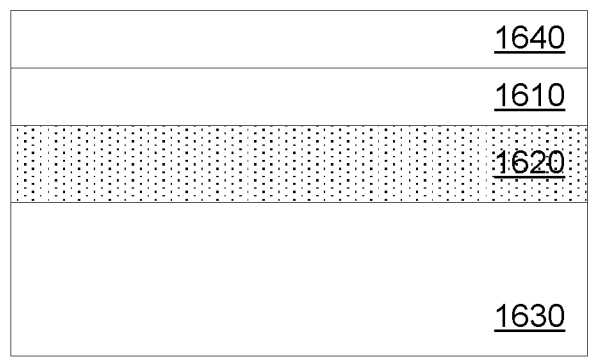

In FIG. 16C, the composite substrate is heated to the deposition temperature of GaN, and a layer 1640 of GaN can be deposited on the silicon layer. In some embodiments, a buffer layer can be deposited before depositing the GaN layer, for example, to perform lattice matching between silicon and GaN. In some embodiments, a thick layer of GaN can be deposited directly on the silicon layer, using a bottom portion of the thick GaN as the buffer layer.

The GaN can be epitaxially deposited using the silicon underlayer as a template. This the GaN can have a lattice constant similar to the lattice constant of silicon at the deposition temperature.

Figure 16D:
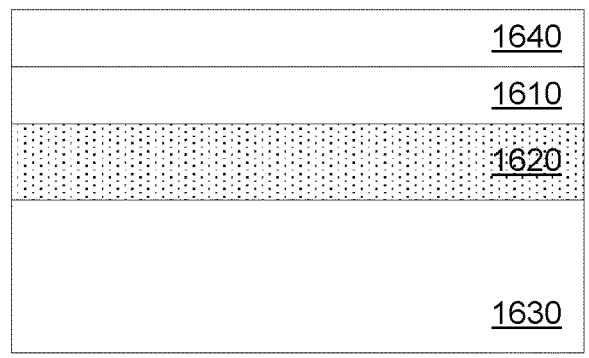

In FIG. 16D, the composite substrate is cooled to the set temperature, or to a temperature that the glass or glass ceramic substrate becomes solid. The GaN layer on the silicon layer can experience stress and strain to accommodate the matching lattices of the two layers due to the differences in CTE. For example, GaN has higher CTE than silicon, thus the GaN layer would have a smaller lattice constant than the silicon. However, since the two layers are bonded, the GaN would be in expansion and the silicon would be in compression. The amount of stress and strain would be proportional to the difference in temperature, e.g., between the deposition temperature and the set point.

Figure 16E:

In FIG. 16E, the composite substrate is cooled to a strain point at a rate that preventing the glass or glass ceramic layer from being relaxed. The cooling time can be less than 2 hours, less than 1 hour, less than 30 minutes, less than 10 minutes from the set temperature to the strain temperature. The strain point can be between 300 and 800 C, or between 400 and 600 C. By cooling at a fast rate, the glass or glass ceramic layer can be strained, e.g., the lattice of the glass or glass ceramic can be maintained at a higher temperature value when the actual temperature of the glass is already lower.

The fast cooling rate can keep the glass or glass ceramic layer at an expansion state, thus can assist in keeping the GaN at less stress or strain state.

Figure 16F:
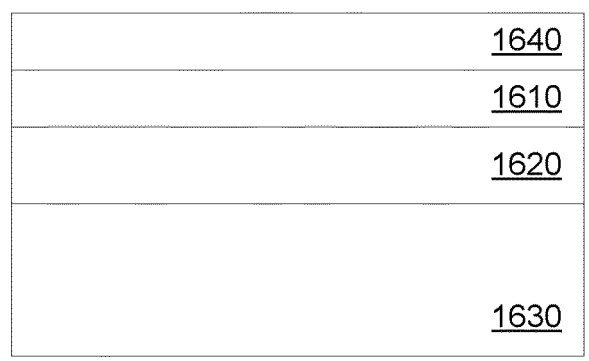

In FIG. 16F, the composite substrate is cooled to the room temperature.

Figure 17:
FIG. 17 illustrates a flow chart for depositing a GaN on a silicon substrate according to some embodiments.

FIG. 17 illustrates a flow chart for depositing a GaN on a silicon substrate according to some embodiments. Operation 1700 provides a composite substrate, wherein the composite substrate comprises a single crystal layer disposed on a glass layer on a support layer, wherein the coefficient of expansion of the support layer is higher than the coefficient of expansion of the single crystal layer. Operation 1710 deposits a layer of GaN on the composite substrate.

In some embodiments, the present invention discloses methods and systems to form free-standing GaN. The methods can include high temperature removing, for example, by etching, the silicon underlayer which serves as the lattice template for the growing of the GaN layer. Since the silicon layer can be thin, order of a few microns or less, it can be easily removed.

Figure 18A:
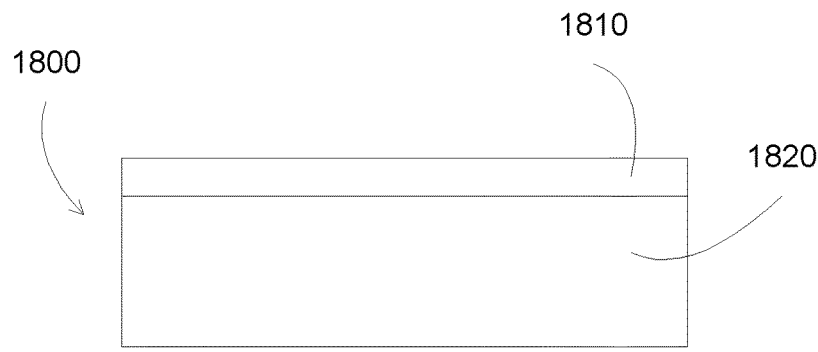
FIGS. 18A-18D illustrate a process for forming a free standing GaN substrate according to some embodiments.

FIGS. 18A-18D illustrate a process for forming a free standing GaN substrate according to some embodiments. In FIG. 18A, a composite substrate 1800 can be provided. The composite substrate can include a single crystal layer 1810, such as a silicon layer formed by exfoliation through implantation as discussed above. The silicon layer 1810 can be disposed on a support substrate 1820. The support layer can be a glass or glass ceramic substrate. There can be an oxide layer 1860 between the silicon layer and the glass or glass ceramic substrate.

Figure 18B:

In FIG. 18B, a GaN layer 1840 can be deposited on the composite substrate 1800. The thickness of the GaN can be less than 100 microns, such as between 3 and 100 microns. The deposition can be performed after the single crystal layer is separate from the support. For example, the composite substrate can be heated in dry hydrogen, such as to the deposition temperature of GaN. The presence of hydrogen in high temperatures can reduce the oxide layer between the single crystal layer and the support layer. This oxide layer can be removed in dry hydrogen ambient at high temperature, releasing the silicon layer from the support layer.

Figure 18C:

In FIG. 18C, the silicon layer can be removed, for example, by etching using HCl chemistry at a same temperature or slightly less (e.g., no more than 100 or 200 C less) than the deposition temperature of GaN. For example, the GaN can be deposited at 1100 C, and the silicon etching can be performed at 1100 C, or between 900 and 1100 C, or between 1000 and 1100 C. In some embodiments, the GaN can be cooled to about 1000 C, and the silicon can be etched at 1000 C. Since the silicon layer is thin, e.g., less than 10 microns, less than 5 microns, less than 2 microns, or less than 1 micron, this silicon layer can be easily and quickly etched.

In some embodiments, the silicon layer is not completely removed.

Figure 18D:
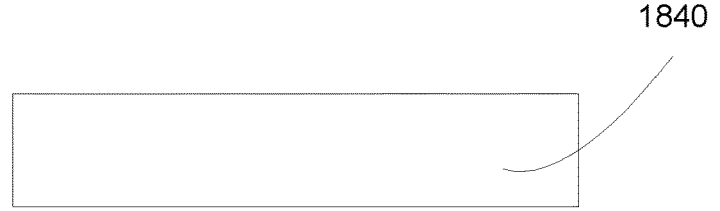

In FIG. 18D, the composite substrate can be brought to room temperature. The composite substrate can include a GaN layer disposed on the support substrate, without any bonding (since the silicon has been removed), or with minimal bonding in case the silicon layer is not completely removed).

Figure 19A:
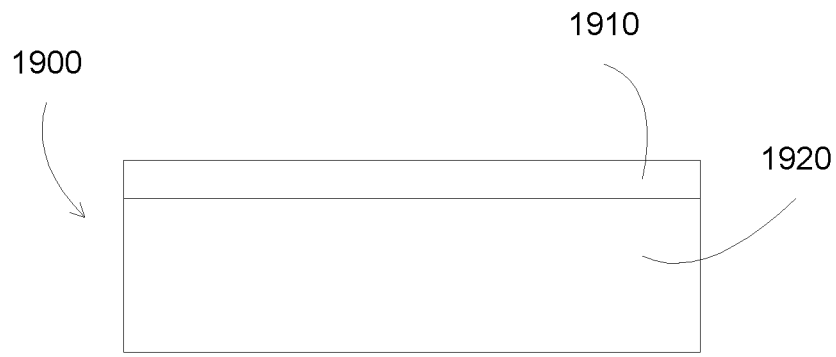
FIGS. 19A-19D illustrate a process for forming a free standing GaN substrate according to some embodiments.

FIGS. 19A-19D illustrate a process for forming a free standing GaN substrate according to some embodiments. In FIG. 19A, a composite substrate 1900 can be provided. The composite substrate can include a single crystal layer 1910, such as a silicon layer formed by exfoliation through implantation as discussed above. The silicon layer 1910 can be disposed on a support substrate 1920.

Figure 19B:
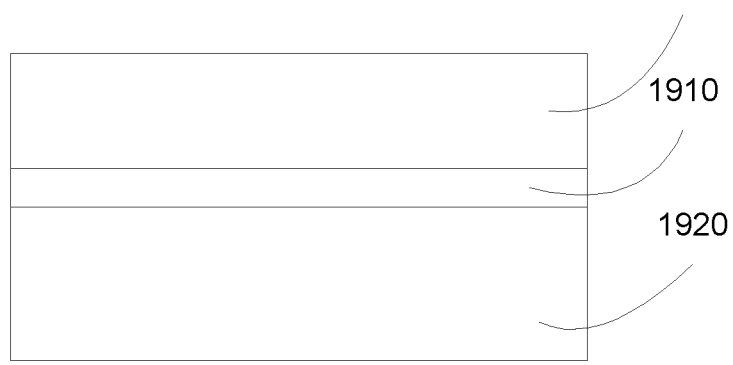
Figure 19C:
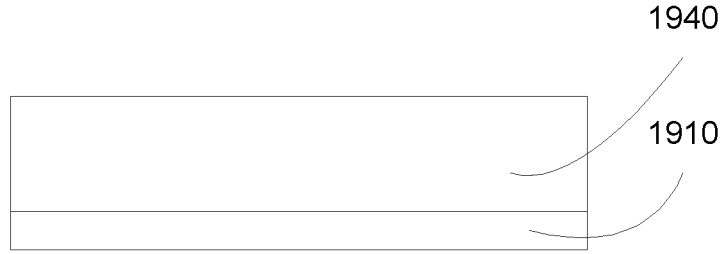
Figure 19D:

In FIG. 19B, a GaN layer 1940 can be deposited on the composite substrate 1900. In FIG. 19C, the support substrate can be removed. In FIG. 19D, the silicon layer can be removed, for example, by etching using HCl chemistry at a same temperature or slightly less (e.g., no more than 100 or 200 C less) than the deposition temperature of GaN. For example, the GaN can be deposited at 1100 C, and the silicon etching can be performed at 1100 C, or between 900 and 1100 C, or between 1000 and 1100 C. In some embodiments, the GaN can be cooled to about 1000 C, and the silicon can be etched at 1000 C. Since the silicon layer is thin, e.g., less than 10 microns, less than 5 microns, less than 2 microns, or less than 1 micron, this silicon layer can be easily and quickly etched.

In some embodiments, the silicon layer is not completely removed. The GaN layer can be brought to room temperature.

FIG. 20 illustrates a flow chart for forming a GaN substrate according to some embodiments. Operation 2000 provides a composite substrate, wherein the composite substrate comprises a single crystal layer disposed on a support layer, wherein the coefficient of expansion of the support layer is higher than the coefficient of expansion of the single crystal layer. Operation 2100 deposits a layer of GaN on the composite substrate. The thickness of the GaN can be less than 100 microns, such as between 3 and 100 microns. The deposition can be performed after the single crystal layer is separate from the support. For example, the composite substrate can be heated in dry hydrogen, such as to the deposition temperature of GaN. The presence of hydrogen in high temperatures can reduce the oxide layer between the single crystal layer and the support layer. For example, the single crystal layer can be a silicon layer, and the support layer can be a glass or glass ceramic layer. There can be an oxide layer between the silicon layer and the glass or glass ceramic layer. This oxide layer can be removed in dry hydrogen ambient at high temperature, releasing the silicon layer from the support layer.

Operation 2020 removes the single crystal layer at a temperature similar to the GaN deposition temperature, wherein the GaN is released from the single crystal layer. For example, the temperature can be reduced to 1000 C, and HCl can be introduced to the deposition to etch silicon. Operation 2030 brings the free-standing GaN to room temperature.

In some embodiments, the present invention discloses methods and systems to form free-standing GaN. The methods can include high temperature removing, for example, by etching, the silicon underlayer which serves as the lattice template for the growing of the GaN layer. Since the silicon layer can be thin, order of a few microns or less, it can be easily removed.

Figure 21A:
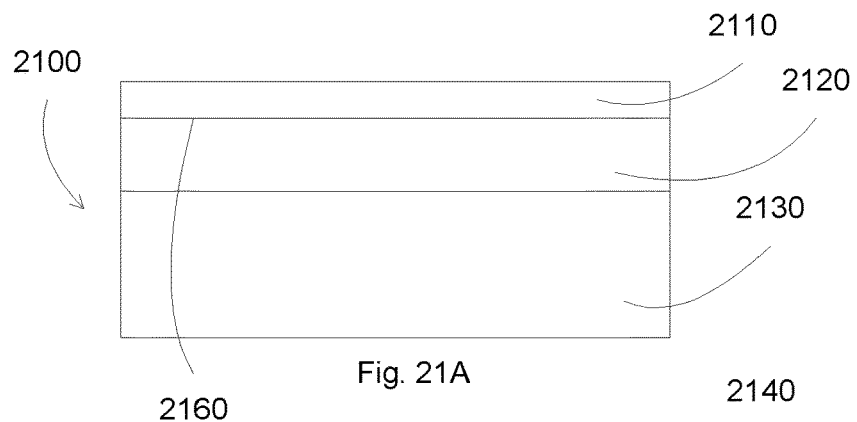
FIGS. 21A-21D illustrate a process for forming a free standing GaN substrate according to some embodiments.

FIGS. 21A-21D illustrate a process for forming a free standing GaN substrate according to some embodiments. In FIG. 21A, a composite substrate 2100 can be provided. The composite substrate can include a single crystal layer 2110, such as a silicon layer formed by exfoliation through implantation as discussed above. The silicon layer 2110 can be disposed on a glass or glass ceramic layer 2120 on a support substrate 2130. There can be an oxide layer 2160 between the silicon layer and the glass or glass ceramic substrate.

Figure 21B:
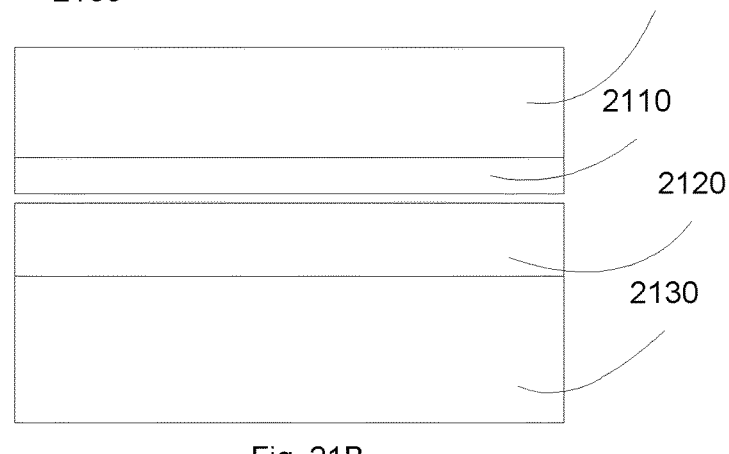

In FIG. 21B, a GaN layer 2140 can be deposited on the composite substrate 2100. The thickness of the GaN can be less than 100 microns, such as between 3 and 100 microns. The deposition can be performed after the single crystal layer is separate from the glass or glass ceramic layer. For example, the composite substrate can be heated in dry hydrogen, such as to the deposition temperature of GaN. The presence of hydrogen in high temperatures can reduce the oxide layer between the single crystal layer and the glass or glass ceramic layer. This oxide layer can be removed in dry hydrogen ambient at high temperature, releasing the silicon layer from the glass or glass ceramic layer. The GaN can be deposited on the silicon layer after the silicon layer is separated from the glass layer.

Alternatively, the single crystal layer can be separate from the glass or glass ceramic layer after the GaN is deposited. For example, a GaN layer can be deposited on the silicon layer of the composite substrate. Afterward, dry hydrogen can be introduced to reduce, e.g., reacting with oxygen in the oxide layer between the silicon layer and the glass layer. The glass or glass ceramic layer can be completely separated or partially separated from the silicon layer in the heated dry hydrogen ambient.

Figure 21C:
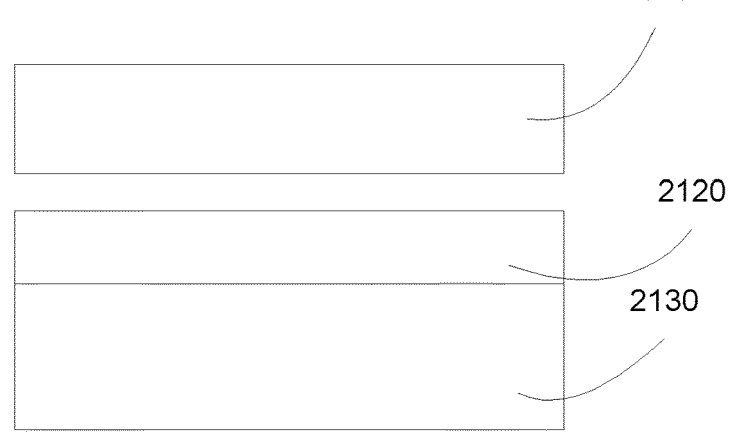

In FIG. 21C, the silicon layer can be removed, for example, by etching using HCl chemistry at a same temperature or slightly less (e.g., no more than 100 or 200 C less) than the deposition temperature of GaN. For example, the GaN can be deposited at 1100 C, and the silicon etching can be performed at 1100 C, or between 900 and 1100 C, or between 1000 and 1100 C. In some embodiments, the GaN can be cooled to about 1000 C, and the silicon can be etched at 1000 C. Since the silicon layer is thin, e.g., less than 10 microns, less than 5 microns, less than 2 microns, or less than 1 micron, this silicon layer can be easily and quickly etched.

In some embodiments, the silicon layer is not completely removed.

Figure 21D:
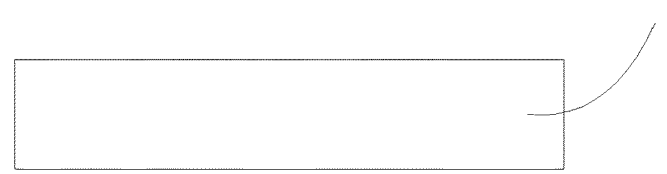

In FIG. 21D, the composite substrate can be brought to room temperature. The composite substrate can include a GaN layer disposed on the glass layer on the support substrate, without any bonding (since the silicon has been removed), or with minimal bonding in case the silicon layer and the oxide layer are not completely removed).

FIG. 22 illustrates a flow chart for forming a GaN substrate according to some embodiments. Operation 2200 provides a composite substrate, wherein the composite substrate comprises a single crystal layer disposed on a glass layer on a support layer.

Operation 2210 exposes the composite substrate to a dry hydrogen ambient in a high temperature, such as 1100C, in which an oxide layer between the silicon layer and the glass or glass ceramic layer is reduced, separating the silicon layer from the glass or glass ceramic layer.

Operation 2220 deposits a layer of GaN on the composite substrate. The thickness of the GaN can be less than 100 microns, such as between 3 and 100 microns. The deposition can be performed after the single crystal layer is separate from the support. For example, the composite substrate can be heated in dry hydrogen, such as to the deposition temperature of GaN. The presence of hydrogen in high temperatures can reduce the oxide layer between the single crystal layer and the support layer. For example, the single crystal layer can be a silicon layer, and the support layer can be a glass or glass ceramic layer. There can be an oxide layer between the silicon layer and the glass or glass ceramic layer. This oxide layer can be removed in dry hydrogen ambient at high temperature, releasing the silicon layer from the support layer.

In some embodiments, the GaN can be deposited before the separation of the silicon layer from the glass or glass ceramic layer.

Operation 2230 removes the single crystal layer at a temperature similar to the GaN deposition temperature, wherein the GaN is released from the single crystal layer. For example, the temperature can be reduced to 1000 C, and HCl can be introduced to the deposition to etch silicon. Operation 2240 brings the free-standing GaN to room temperature.

What is claimed is:

1. A method comprising
selecting a first substrate, wherein the first substrate comprises a glass or a glass-ceramic substrate, wherein the first substrate has a thermal expansion coefficient (CTE) and a strain point, where the thermal expansion coefficient is higher than that of silicon, wherein the strain point is between 600 and 800° C.;
exfoliating a film of single crystal silicon onto a first side of the first substrate wherein the thickness of the single crystal silicon film is less than 5 micron, wherein the first substrate is configured to form a composite substrate with the single crystal silicon film, wherein the thickness of the first substrate is selected so that the composite substrate has a comparable thermal expansion coefficient with GaN, wherein a difference between the thermal expansion coefficients of the composite substrate and of GaN is less than 30%, wherein the comparable thermal expansion coefficient is configured to allow depositing a GaN film on the first substrate without cracking;
bonding a second side of the first substrate to a handle substrate.

2. A method as in claim 1
wherein the thickness of the single crystal silicon film is less than 1 micron.

3. A method as in claim 1
wherein the glass-ceramic substrate comprises a fused mixture of a refractory ceramic powder and a glass powder.

4. A method as in claim 1
wherein the first substrate has a CTE of 4 ppm/° C. to 6.5 ppm/° C.

5. A method as in claim 1
wherein the composite substrate has a thermal expansion coefficient between 0.7 and 1 of the thermal expansion coefficient of GaN.

6. The method as in claim 1
wherein the composite substrate has a thermal expansion coefficient between 0.8 and 1 of the thermal expansion coefficient of GaN.

7. A method comprising
selecting a glass or glass-ceramic substrate, wherein the glass substrate has a thermal expansion coefficient and a strain point, where the thermal expansion coefficient is higher than that of silicon, wherein the strain point is between 400 and 600° C.;
exfoliating a film of single crystal silicon onto a first side of the glass or glass-ceramic substrate, wherein the thickness of the single crystal silicon film is less than 5 micron, wherein the glass substrate is configured to form a composite substrate with the single crystal silicon film, wherein the thickness of the glass or glass-ceramic substrate is selected so that the composite substrate has a comparable thermal expansion coefficient with GaN, wherein a difference between the thermal expansion coefficients of the composite substrate and of GaN is less than 30%, wherein the comparable thermal expansion coefficient is configured to allow depositing a GaN film on the composite substrate without cracking;
bonding a second side of the glass or glass-ceramic substrate to a handle substrate.

8. The method as in claim 7
wherein the thickness of the single crystal silicon film is less than 1 micron.

9. The method as in claim 7
wherein the glass-ceramic substrate comprises a fused mixture of a refractory ceramic powder and a glass powder.

10. The method as in claim 9
wherein the refractory ceramic powder comprises mullite, cordierite, silicon carbide, aluminum nitride, or a combination thereof.

11. The method as in claim 7
wherein the composite substrate has a thermal expansion coefficient between 0.7 and 1 of the thermal expansion coefficient of GaN.

* * * * *